US012652879B2

(12) United States Patent
Hayashi

(10) Patent No.: US 12,652,879 B2
(45) Date of Patent: Jun. 9, 2026

(54) PHOTOELECTRIC CONVERSION APPARATUS HAVING CAPACITANCE ADDITION TRANSISTOR, PHOTOELECTRIC CONVERSION SYSTEM, AND MOVABLE BODY

(71) Applicant: CANON KABUSHIKI KAISHA, Tokyo (JP)

(72) Inventor: Shuhei Hayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 851 days.

(21) Appl. No.: 17/819,762

(22) Filed: Aug. 15, 2022

(65) Prior Publication Data

US 2023/0069364 A1 Mar. 2, 2023

(30) Foreign Application Priority Data

Aug. 27, 2021 (JP) ................................. 2021-138746

(51) Int. Cl.
H10F 39/00 (2025.01)

(52) U.S. Cl.
CPC ....... H10F 39/812 (2025.01); H10F 39/8037 (2025.01)

(58) Field of Classification Search
CPC ............................ H10F 39/812; H10F 39/8037
See application file for complete search history.

(56) References Cited

U.S. PATENT DOCUMENTS

2014/0071244 A1* 3/2014 Hirota ................. H10F 39/8063
348/46
2019/0020839 A1* 1/2019 Velichko .............. H04N 25/771

2020/0186732 A1* 6/2020 Takizawa ............. H04N 25/771
2020/0358989 A1* 11/2020 Hoshino .............. H04N 25/134
2022/0053152 A1* 2/2022 Ikuma .................. H04N 25/771

FOREIGN PATENT DOCUMENTS

| | | |
|---|---|---|
| JP | 2006217410 A | 8/2006 |
| WO | 2012161225 A1 | 11/2012 |
| WO | 2013183382 A1 | 12/2013 |
| WO | 2017169754 A1 | 10/2017 |
| WO | 2018221261 A1 | 12/2018 |
| WO | 2019102887 A1 | 5/2019 |
| WO | 2020241289 A1 | 12/2020 |

* cited by examiner

*Primary Examiner* — Thanh Luu
*Assistant Examiner* — Mai Thi Ngoc Tran
(74) *Attorney, Agent, or Firm* — Canon U.S.A., Inc. IP Division

(57) ABSTRACT

A photoelectric conversion apparatus includes first and second photoelectric conversion circuits, an FD configured to hold signal charges, a first transfer transistor configured to control transfer of the signal charge from the first photoelectric conversion circuit to the FD, a second transfer transistor configured to control transfer of the signal charge from the second photoelectric conversion circuit to the FD, a first capacitor circuit configured to hold a signal charge overflowing from the first photoelectric conversion circuit, and a second capacitor circuit configured to hold a signal charge overflowing from the second photoelectric conversion circuit. The first capacitor circuit is connected to a capacitance addition transistor via a first capacitor-connected transistor. The second capacitor circuit is connected to the capacitance addition transistor via a second capacitor-connected transistor. The first and second capacitor-connected transistors are connected to the FD via the capacitance addition transistor.

18 Claims, 24 Drawing Sheets

FRONT VIEW *1300*

*1302*

TOP VIEW

*1302*

*1300*

*1313*     *1303*

*1312*

REAR VIEW

PHOTOELECTRIC CONVERSION APPARATUS HAVING CAPACITANCE ADDITION TRANSISTOR, PHOTOELECTRIC CONVERSION SYSTEM, AND MOVABLE BODY

FIELD OF THE EMBODIMENT

One disclosed aspect of the embodiments relates to a photoelectric conversion apparatus, a photoelectric conversion system, and a movable body.

DESCRIPTION OF THE RELATED ART

In recent years, in an imaging system of a digital still camera, a digital video camera, and the like, a photoelectric conversion apparatus that consumes less power and can perform high-speed reading, such as a complementary metal-oxide-semiconductor (CMOS) image sensor, is used. Japanese Patent Application Laid-Open No. 2006-217410 discusses a photoelectric conversion apparatus in which each pixel includes a plurality of photoelectric conversion circuits, a floating diffusion node (FD), a transfer transistor disposed between the photoelectric conversion circuits and the FD, and a capacitor that holds signal charges generated by the photoelectric conversion circuits. Japanese Patent Application Laid-Open No. 2006-217410 discusses a capacitor-connected transistor that controls the connection between the capacitor and the FD.

SUMMARY

According to an aspect of the embodiments, a photoelectric conversion apparatus includes a first photoelectric conversion circuit and a second photoelectric conversion circuit, a floating diffusion node, a first transfer transistor, a second transfer transistor, an amplification transistor, a first capacitor circuit, and a second capacitor circuit. The floating diffusion node is configured to hold signal charges transferred from the first and second photoelectric conversion circuits. The first transfer transistor is configured to control transfer of the signal charge from the first photoelectric conversion circuit to the floating diffusion node. The second transfer transistor is configured to control transfer of the signal charge from the second photoelectric conversion circuit to the floating diffusion node, an amplification transistor connected to the floating diffusion node. The first capacitor circuit is configured to hold a signal charge overflowing from the first photoelectric conversion circuit. The second capacitor circuit is configured to hold a signal charge overflowing from the second photoelectric conversion circuit. The first capacitor circuit is connected to a capacitance addition transistor via a first capacitor-connected transistor. The second capacitor circuit is connected to the capacitance addition transistor via a second capacitor-connected transistor. The first and second capacitor-connected transistors are connected to the floating diffusion node via the capacitance addition transistor.

Further features of the disclosure will become apparent from the following description of exemplary embodiments with reference to the attached drawings.

BRIEF DESCRIPTION OF THE DRAWINGS

FIG. 3 is an equivalent circuit diagram of a pixel of the photoelectric conversion apparatus according to the first exemplary embodiment.

FIG. 13 is a timing chart of the photoelectric conversion apparatus according to the fourth exemplary embodiment.

DESCRIPTION OF THE EMBODIMENTS

Figure 1:
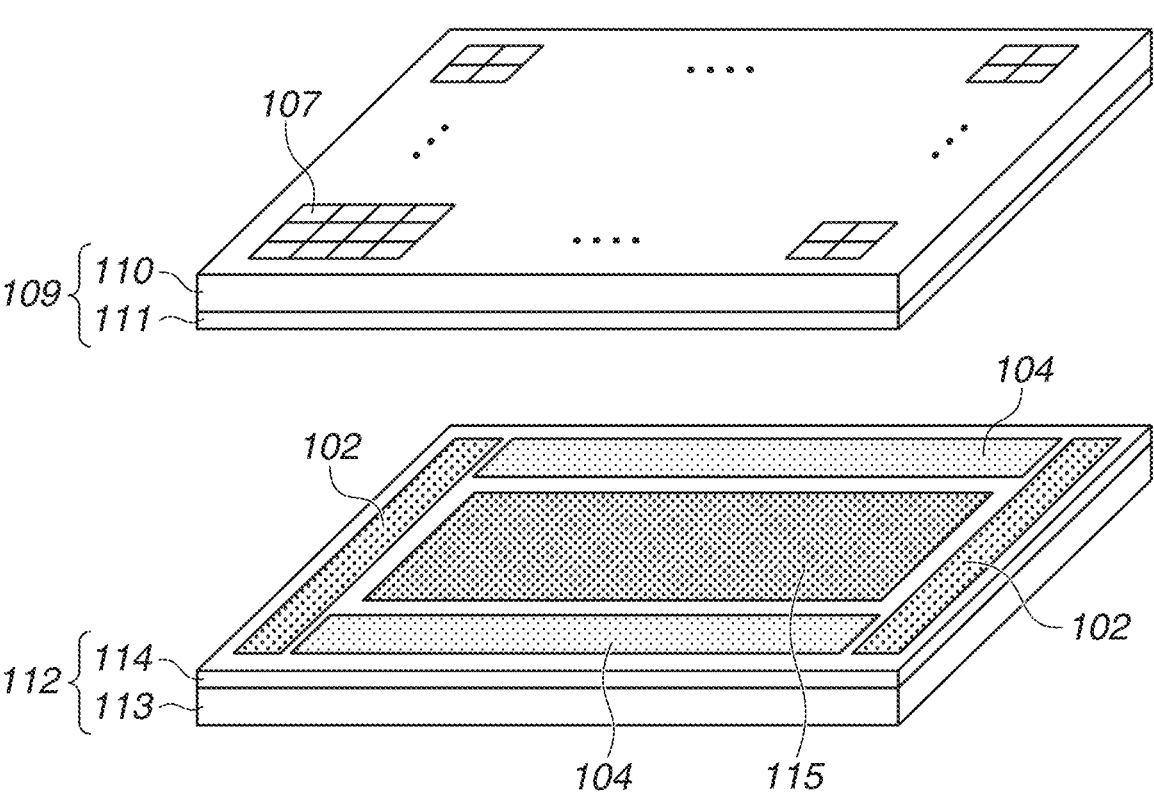
FIG. 1 is a schematic diagram of semiconductor substrates of a photoelectric conversion apparatus according to a first exemplary embodiment.

Exemplary embodiments illustrated below merely make the technical idea of the disclosure specific, and do not limit the disclosure. The sizes of and the positional relationships between members illustrated in the drawings are occasionally exaggerated to clarify the description. In the following description, similar components are occasionally designated by the same numbers and not described. In the following, the term "circuit" may refer to a software context, a hardware context, or a combination of software and hardware contexts. In the software context, the term "circuit" refers to a functionality, an application, a software module, a function, a routine, a set of instructions, or a program that can be executed by a programmable processor such as a microprocessor, a central processing circuit (CPU), or a specially designed programmable device or controller. A memory contains instructions or program that, when executed by the CPU, cause the CPU to perform operations corresponding to circuits or functions. In the hardware context, the term "circuit" refers to a hardware element, a circuit, an assembly, a physical structure, a system, a module, or a subsystem. It may include mechanical, optical, or electrical components, or any combination of them. It may include active (e.g., transistors) or passive (e.g., capacitor) components. It may include semiconductor devices having a substrate and other layers of materials having various concentrations of conductivity. It may include a CPU or a programmable processor that can execute a program stored in a memory to perform specified functions. It may include logic elements (e.g., AND, OR) implemented by transistor circuits or any other switching circuits. In the combination of software and hardware contexts, the term "circuit" or "circuit" refers to any combination of the software and hardware contexts as described above.

The following descriptions will be provided using as an example a case where a signal charge is an electron. Thus, a semiconductor region of a first conductivity type where carriers of the same conductivity type as a signal charge are majority carriers is an N-type semiconductor region, and a semiconductor region of a second conductivity type is a P-type semiconductor region. Also in a case where a signal charge is a hole, the disclosure holds. In this case, a semiconductor region of the first conductivity type where carriers of the same conductivity type as the signal charge are majority carriers is a P-type semiconductor region, and a semiconductor region of the second conductivity type is an N-type semiconductor region.

In the specification and the claims, the term "impurity concentration" means a net impurity concentration compensated for with impurities of the opposite conductivity type. In other words, an "impurity concentration" refers to a net doping concentration. A region where a P-type added impurity concentration is higher than an N-type added impurity concentration is a P-type semiconductor region. Conversely, a region where an N-type added impurity concentration is higher than a P-type added impurity concentration is an N-type semiconductor region.

In the specification, a "planar view" refers to a view in a direction perpendicular to a light incident surface of a semiconductor substrate or a surface opposed to the light incident surface. A "section" refers to a surface in a direction perpendicular to the light incident surface of the semiconductor substrate. In a case where the light incident surface of the semiconductor substrate is a rough surface when viewed microscopically, a planar view is defined based on the light incident surface of the semiconductor substrate when viewed macroscopically.

In the specification, a depth direction is a direction from the light incident surface (a first surface) of the semiconductor substrate to a surface (a second surface) of the semiconductor substrate on the side where a transistor is disposed.

A first exemplary embodiment will be described below. FIG. 1 illustrates a photoelectric conversion apparatus 500 according to the first exemplary embodiment. The photoelectric conversion apparatus 500 is a semiconductor device integrated circuit (IC). The photoelectric conversion apparatus 500 according to the present exemplary embodiment can be used as, for example, an image sensor, a photometric sensor, or a distance measurement sensor. A complementary metal-oxide-semiconductor (CMOS) image sensor will be described below as an example.

The photoelectric conversion apparatus 500 is a laminated photoelectric conversion apparatus in which all or parts of substrates 109 and 112 are laminated and joined together. The substrates 109 and 112 may be in the state of a chip obtained by dicing a wafer after the lamination, or may be in the state of a wafer. The photoelectric conversion apparatus 500 is a laminated back-side illumination photoelectric conversion apparatus.

The substrate 109 has a semiconductor element layer 110 (a first semiconductor element layer) including pixel circuits included in pixels 107, and a wiring structure 111 (a first wiring structure). In the specification, a "semiconductor element layer" includes not only a semiconductor layer but also the gate of a transistor formed in the semiconductor layer. Wiring layers in a wiring structure are not included in the "semiconductor element layer". The substrate 112 has a wiring structure 114 (a second wiring structure) and a semiconductor element layer 113 (a second semiconductor element layer) including an electric circuit. The wiring structure 111 of the substrate 109 and the wiring structure 114 of the substrate 112 are joined together by metal joint portions formed by joining wiring layers included in the wiring structures 111 and 114, which will be described below in detail. Each metal joint portion has a structure where a metal forming a wiring layer and a metal forming a wiring layer are directly joined together.

Elements included in the pixels 107 are disposed in the semiconductor element layer 110, which will be described below in detail. Some of the components of the pixels 107 may be disposed in the semiconductor element layer 110, and the other components of the pixels 107 may be disposed in a semiconductor element layer. In this case, examples of the components of pixel circuits disposed in the semiconductor element layer 110 among the pixels 107 include photoelectric conversion circuits such as photodiodes (PDs). The pixel circuits including the photoelectric conversion circuits are disposed in a two-dimensional array in a planar view in the semiconductor element layer 110. The semiconductor element layer 110 includes a pixel region where a plurality of pixel circuits is disposed in a two-dimensional array. In FIG. 1, in the semiconductor element layer 110, a plurality of photoelectric conversion circuits included in a plurality of pixel circuits is disposed in a two-dimensional array in a row direction and a column direction.

The wiring structure 111 includes M (M is an integer greater than or equal to 1) wiring layers and interlayer insulating materials. The wiring structure 114 includes N (N is an integer greater than or equal to 1) wiring layers and interlayer insulating materials.

The semiconductor element layer 113 includes an electric circuit that processes signals obtained by the photoelectric conversion circuits disposed in the semiconductor element layer 110. For the convenience of description, in FIG. 1, components illustrated on an upper surface of the substrate 112 are disposed in the semiconductor element layer 113. For example, the electric circuit is any one of transistors included in vertical scanning circuits 102, horizontal scanning circuits 104, and a signal processing circuit 115 illustrated in FIG. 1. For example, the signal processing circuit 115 is at least any one of some of the components of the pixels 107, such as an amplification transistor, a selection transistor, and a reset transistor, an amplification circuit, a selection circuit, a logical operation circuit, an analog-to-digital (AD) conversion circuit, a memory, and a circuit that performs a compression process and a combining process.

The pixels 107 can refer to the minimum circuits of circuits repeatedly placed to form an image. The pixel circuit included in each pixel 107 and disposed in the semiconductor element layer 110 only needs to include at least a photoelectric conversion circuit. The pixel circuit may include a component other than the photoelectric conversion circuit. For example, the pixel circuit may further include at least any one of a transfer transistor, a floating diffusion node (FD), a reset transistor, an amplification transistor, a capacitor-connected transistor, and a selection transistor. Typically, a selection transistor and a group of elements connected to a signal line via the selection transistor are included in the pixel 107. That is, the selection transistor can be an outer edge of the pixel circuit. Alternatively, a set of a photoelectric conversion circuit and a transfer transistor can also be included in the pixel 107. Yet alternatively, a set of one or more photoelectric conversion circuits and a single amplification circuit or a single AD conversion circuit may be included in the pixel 107.

Figure 2:
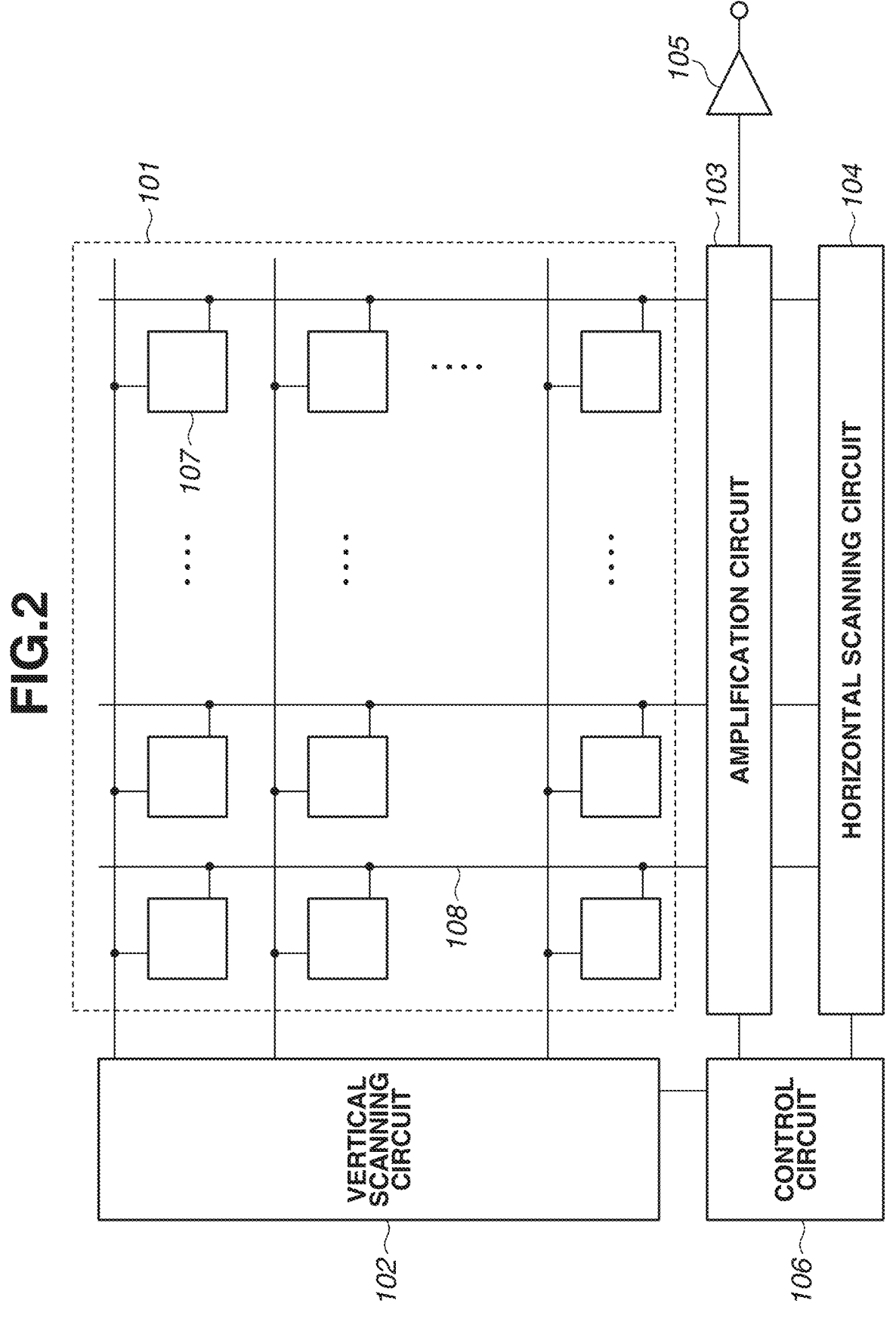
FIG. 2 is a block diagram of the photoelectric conversion apparatus according to the first exemplary embodiment.

FIG. 2 is a block diagram illustrating the general configuration of the photoelectric conversion apparatus according to the present exemplary embodiment. The photoelectric conversion apparatus includes a pixel array 101, a vertical scanning circuit 102, an amplification circuit 103, a horizontal scanning circuit 104, an output circuit 105, and a control circuit 106. The pixel array 101 includes a plurality of pixels 107 arranged in two dimensions including a plurality of rows and a plurality of columns in a planar view. The vertical scanning circuit 102 supplies a plurality of control signals for controlling a plurality of transistors included in the pixels 107 to be on (a conducting state) or off (a non-conducting state). In the columns of the pixels 107, signal lines 108 are provided, and signals from the pixels 107 are read out to the signal lines 108 on the column-by-column basis. The amplification circuit 103 amplifies the pixel signals output to the signal lines 108 and performs a process such as a correlated double sampling process on the pixel signals based on signals when the pixels 107 are reset and signals when photoelectric conversion is performed. The horizontal scanning circuit 104 includes switches connected to amplifiers of the amplification circuit 103 and supplies control signals for controlling the switches to be on or off. The control circuit 106 controls the vertical scanning circuit 102, the amplification circuit 103, and the horizontal scanning circuit 104. The output circuit 105 includes a buffer amplifier and a differential amplifier and outputs the pixel signals from the amplification circuit 103 to a signal processing circuit outside the photoelectric conversion apparatus. A configuration may be employed in which an AD conversion circuit is further provided in the photoelectric conversion apparatus, so that the photoelectric conversion apparatus outputs digital pixel signals. The control circuit 106, the amplification circuit 103, and the output circuit 105 are included in the signal processing circuit 115 in FIG. 1.

Figure 3:
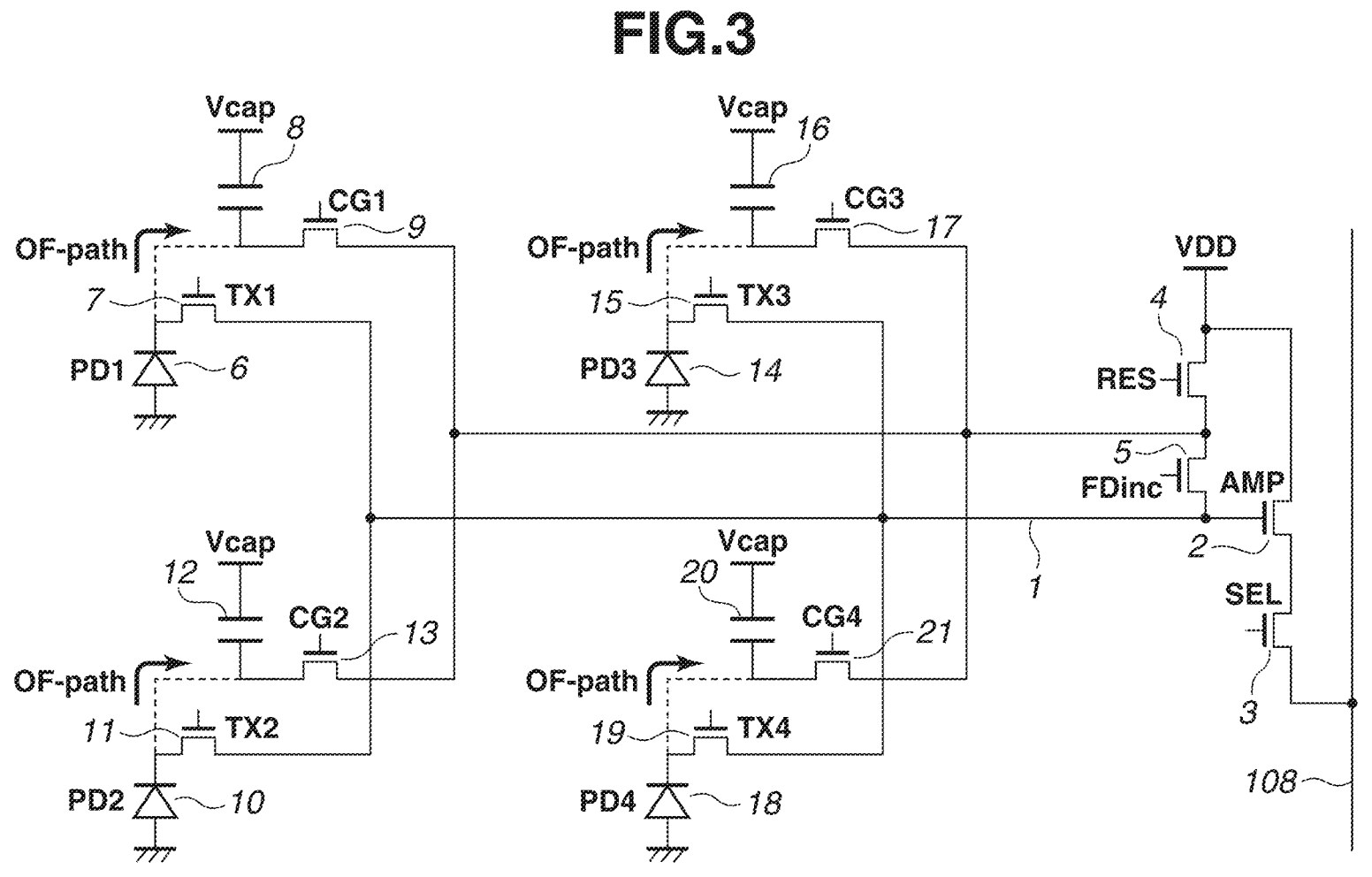

FIG. 3 illustrates an equivalent circuit of a pixel of the photoelectric conversion apparatus according to the present exemplary embodiment. A description will be provided below of a form in which four photoelectric conversion circuits share a single FD point, node, area, or region. The number of photoelectric conversion circuits that share the FD is not limited to this. The number of photoelectric conversion circuits that share the FD only needs to be at least two. Each pixel 107 includes photoelectric conversion circuits 6, 10, 14, and 18, transfer transistors 7, 11, 15, and 19, capacitor circuits 8, 12, 16, and 20, capacitor-connected transistors 9, 13, 17, and 21, and a capacitance addition transistor 5. Further, the pixel 107 includes an FD 1, a reset transistor 4, an amplification transistor 2, and a selection transistor 3. Each of the transfer transistors 7, 11, 15, and 19, the capacitor-connected transistors 9, 13, 17, and 21, the reset transistor 4, the amplification transistor 2, the selection transistor 3, and the capacitance addition transistor 5 can be composed of a metal-oxide-semiconductor (MOS) transistor. A control signal for controlling each of these transistors is input from the vertical scanning circuit 102 illustrated in FIG. 1 to the gate of the transistor via a control line.

As illustrated in FIG. 3, a single transfer transistor, a single capacitor circuit, and a single capacitor-connected transistor are disposed for a single photoelectric conversion circuit. More specifically, the transfer transistor 7, the capacitor circuit 8, and the capacitor-connected transistor 9 are disposed in correspondence with the photoelectric conversion circuit 6. The transfer transistor 11, the capacitor circuit 12, and the capacitor-connected transistor 13 are disposed in correspondence with the photoelectric conversion circuit 10. The transfer transistor 15, the capacitor circuit 16, and the capacitor-connected transistor 17 are disposed in correspondence with the photoelectric conversion circuit 14. The transfer transistor 19, the capacitor circuit 20, and the capacitor-connected transistor 21 are disposed in correspondence with the photoelectric conversion circuit 18. While a description will be provided below taking the photoelectric conversion circuit 6 as an example on behalf of the photoelectric conversion circuits 6, 10, 14, and 18, the photoelectric conversion circuits 10, 14, and 18 also have functions similar to that of the photoelectric conversion circuit 6. While the transfer transistors 7, 11, 15, and 19, the capacitor circuits 8, 12, 16, and 20, and the capacitor-connected transistors 9, 13, 17, and 21 also have similar functions, the transfer transistor 7, the capacitor circuit 8, and the capacitor-connected transistor 9 are described on behalf of the transfer transistors 7, 11, 15, and 19, the capacitor circuits 8, 12, 16, and 20, and the capacitor-connected transistors 9, 13, 17, and 21.

The photoelectric conversion circuit 6 photoelectrically converts incident light and also accumulates a signal charge (an electron) generated by the photoelectric conversion. As the photoelectric conversion circuit 6, for example, a PD is used.

In a case where accumulated electrons come close to the number of saturated electrons of the photoelectric conversion circuit 6, an electron that cannot be accumulated in the photoelectric conversion circuit 6 overflows to the capacitor circuit 8, and the capacitor circuit 8 holds at least one of the overflow electron and a signal corresponding to the overflow electron. As the capacitor circuit 8, a metal-insulator-metal (MIM) capacitor and/or a MOS capacitor can be used. Using a MIM capacitor, it is possible to increase capacitance while securing the degree of freedom in the design layout of the semiconductor substrate.

The transfer transistor 7 is controlled to be on by a control signal input to the gate of the transfer transistor 7, thus transferring a charge accumulated in the photoelectric conversion circuit 6 to the FD 1. The FD 1 is connected to the gate of the amplification transistor 2.

The capacitor-connected transistor 9 is controlled to be on by a control signal input to the gate of the capacitor-connected transistor 9, thus transferring a charge accumulated in the capacitor circuit 8. The capacitance addition transistor 5 is connected to the FD 1 and one node of the capacitor-connected transistor 9. The path of the signal charge transferred via the transfer transistor 7 and the path of the signal charge accumulated in the capacitor circuit 8 and transferred via the capacitor-connected transistor 9 are separate from each other. The capacitance addition transistor 5 controls whether to add the signal held in the capacitor circuit 8. In other words, the capacitor circuit 8 and the FD 1 are connected together by the capacitor-connected transistor 9 and the capacitance addition transistor 5 being simultaneously turned on. Thus, it is possible to reduce an increase in the FD capacitance. Details thereof will be described below.

As a comparative embodiment, a case is considered where the capacitance addition transistor 5 is not included, and one node of the capacitor-connected transistor 9 is directly connected to the FD 1. The comparative embodiment is similar to the present exemplary embodiment, except that the capacitance addition transistor 5 is not disposed. In the comparative embodiment, if a plurality of PDs shares the FD 1, the number of capacitor-connected transistors 9 connected to the FD 1 also increases. Thus, the FD capacitance may increase, and noise may be likely to occur. In particular, in a case where an object has a low illuminance, the influence of noise due to the attachment of excess capacitance to the FD 1 becomes conspicuous.

In contrast, in the present exemplary embodiment, the FD 1 and the capacitor-connected transistor 9 connecting the FD 1 and the capacitor circuit 8 are connected via the capacitance addition transistor 5. The inclusion of capacitor circuit 8 enables the dynamic range to be extended. Even if the number of PDs that share the FD 1 increases, capacitance to be attached to the FD 1 is only the capacitance of the capacitance addition transistor 5, and the capacitance of the gate of the capacitor-connected transistor 9 is not added. Thus, it is possible to reduce an increase in FD capacitance even in a case where a plurality of PDs shares an FD, while extending the dynamic range.

One node of the capacitor-connected transistor 9 and one node of the capacitor-connected transistor 13 are formed of a common N-type semiconductor region 45. A configuration may be employed in which these nodes are connected by a wire instead of a common N-type semiconductor region. Similarly, one node of the capacitor-connected transistor 17 and one node of the capacitor-connected transistor 21 are formed of a common N-type semiconductor region 46.

A configuration may be employed in which these nodes are also connected together by a wire instead of a common N-type semiconductor region. The N-type semiconductor regions 45 and 46 are connected by an electrical wire 28. The electrical wire 28 is connected to one node of the capacitance addition transistor 5. The other node of the capacitance addition transistor 5 and the gate of the amplification transistor 2 are connected together by an electrical wire 27.

One node (e.g., the drain) of the amplification transistor 2 is connected to a power supply voltage line VDD, and the other node (e.g., the source) of the amplification transistor 2 is connected to the drain of the selection transistor 3. The source of the selection transistor 3 is connected to a signal line 108.

A constant current source (not illustrated) is connected to the signal line 108. The selection transistor 3 is controlled to be on by a control signal input to the gate of the selection transistor 3, thus connecting the source of the amplification transistor 2 and the signal line 108 and functioning as a source follower. At this time, an output signal Vout based on the voltage of the FD 1 is output to the amplification circuit 103 illustrated in FIG. 2 via the signal line 108 in each column.

The reset transistor 4 and the capacitance addition transistor 5 are controlled to be simultaneously on by control signals input to the respective gates of the reset transistor 4 and the capacitance addition transistor 5, thus resetting the voltage of the FD 1. At this time, the capacitor-connected transistor 9 is also simultaneously turned on, so that the charge accumulated in the capacitor circuit 8 connected to the FD 1 can also be reset.

Figure 4:
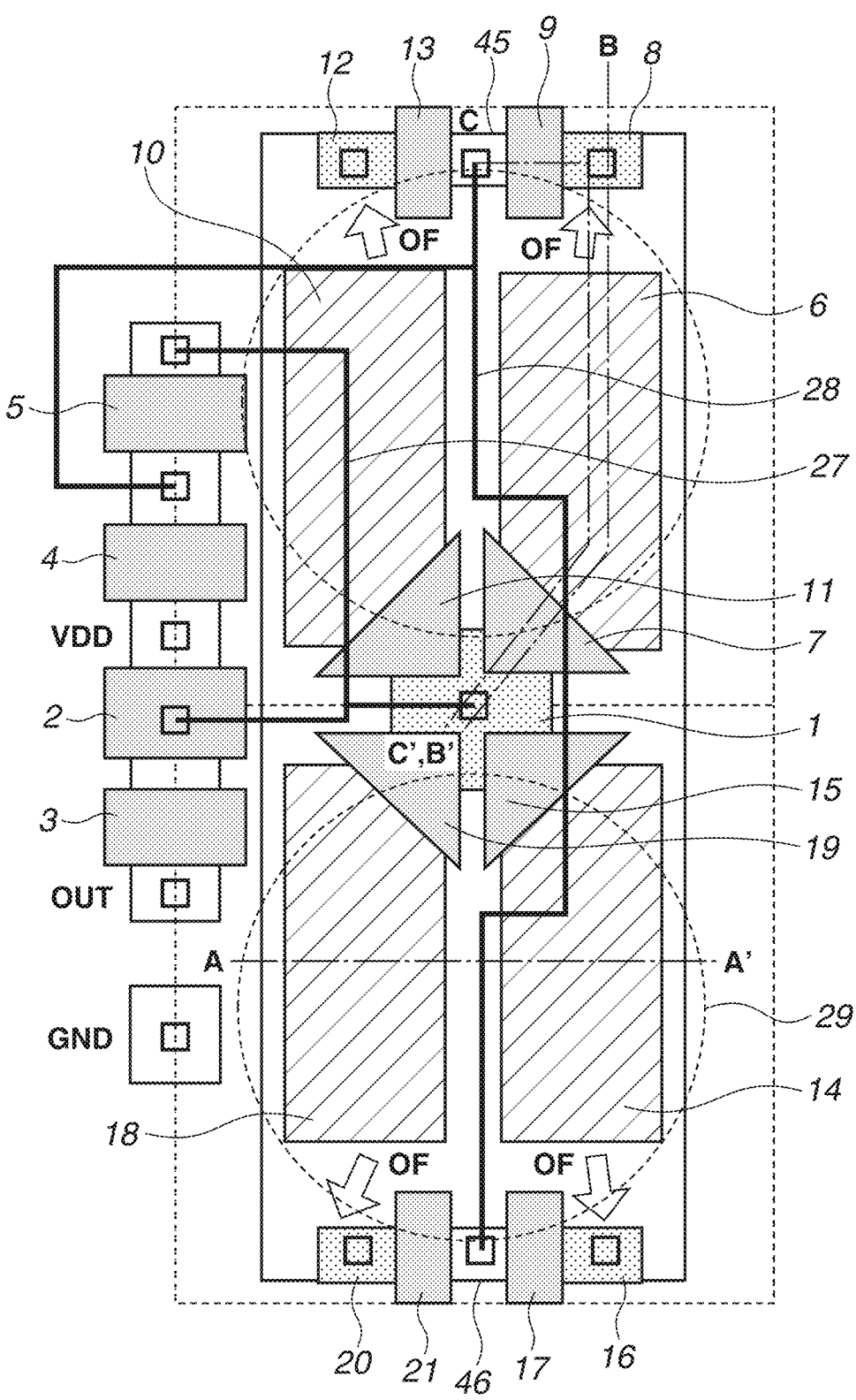
FIG. 4 is a schematic plan view of the photoelectric conversion apparatus according to the first exemplary embodiment.
Figure 5:
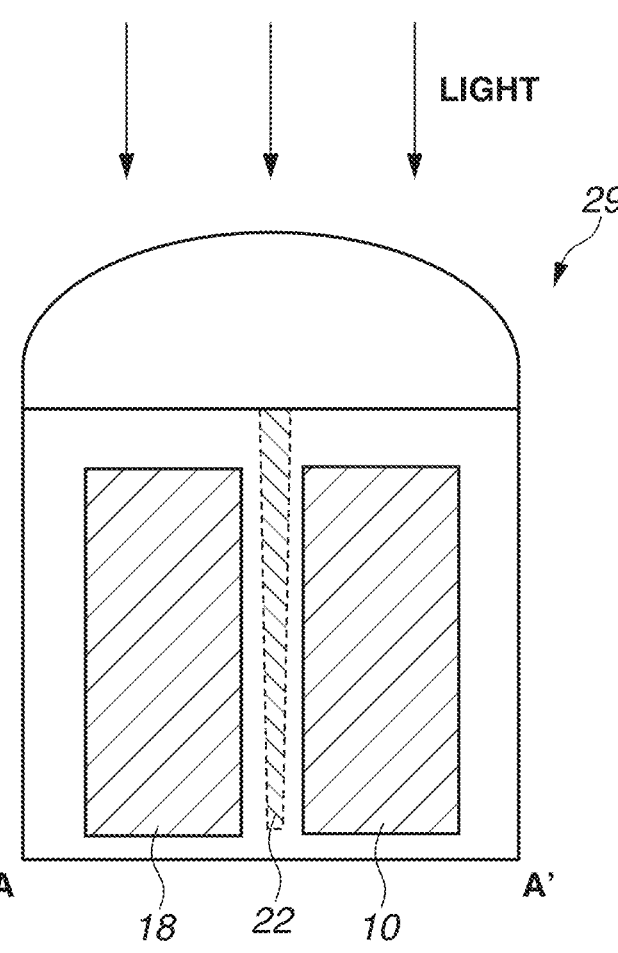
FIG. 5 is a schematic sectional view of the photoelectric conversion apparatus according to the first exemplary embodiment.

FIG. 4 is a plan view of the pixel of the photoelectric conversion apparatus according to the present exemplary embodiment. FIG. 5 is a schematic sectional view of a first substrate along A-A' in FIG. 4. Each of the photoelectric conversion circuits 6, 10, 14, and 18 in FIG. 4 indicates an N-type semiconductor region included in a PD. In FIG. 4, each of the capacitor circuits 8, 12, 16, and 20 is a MOS capacitor and is formed of an N-type semiconductor region. The configuration of the capacitor circuit is not limited to this. Alternatively, a MIM capacitor may be connected to the N-type semiconductor region of the capacitor circuit.

As illustrated in FIG. 4, in the present exemplary embodiment, a contact GND that supplies a fixed potential to a well is connected. For example, the fixed potential is a ground potential. The contact GND is not an essential component.

As illustrated in FIG. 5, a microlens 29 is disposed to overlap a plurality of photoelectric conversion circuits at line A-A' in FIG. 4. It is possible to perform image surface phase difference autofocus (AF) using two PDs that share the microlens 29. The gates of the transistors are disposed on a surface opposed to a surface of the semiconductor substrate on the side where the microlens 29 is disposed. Deep trench isolation (DTI) 22 is disposed between the photoelectric conversion circuits. This reduces the movement of a charge between the photoelectric conversion circuits. The DTI 22 is not essential, and the photoelectric conversion circuits may be isolated by insulation isolation such as shallow trench isolation (STI) or by PN isolation. Although the DTI 22 is formed in partway of the semiconductor substrate in FIG. 5, the DTI 22 may penetrate the semiconductor substrate.

Figure 6A:
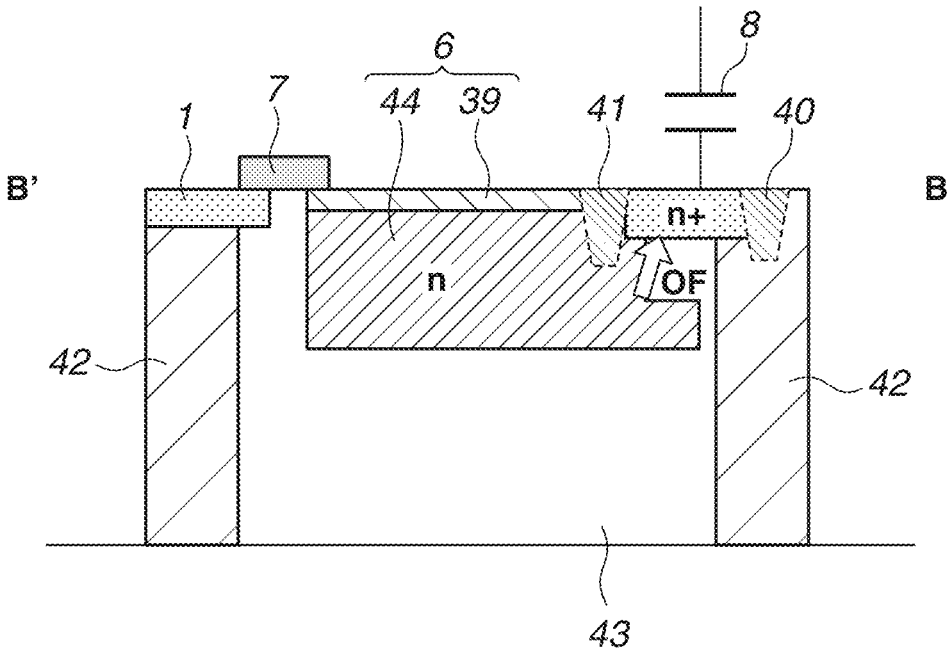
FIGS. 6A and 6B are schematic sectional views of the photoelectric conversion apparatus according to the first exemplary embodiment.
Figure 6B:
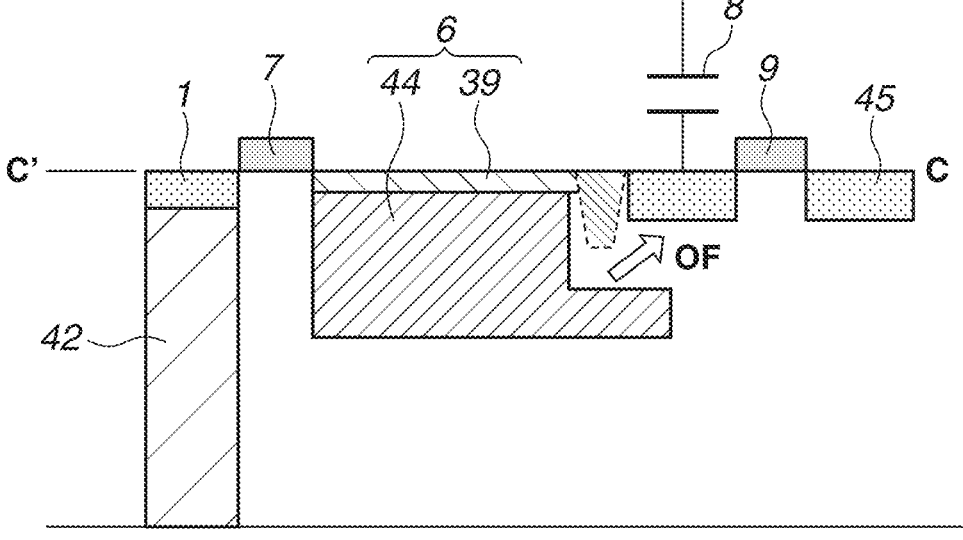
Figure 7A:
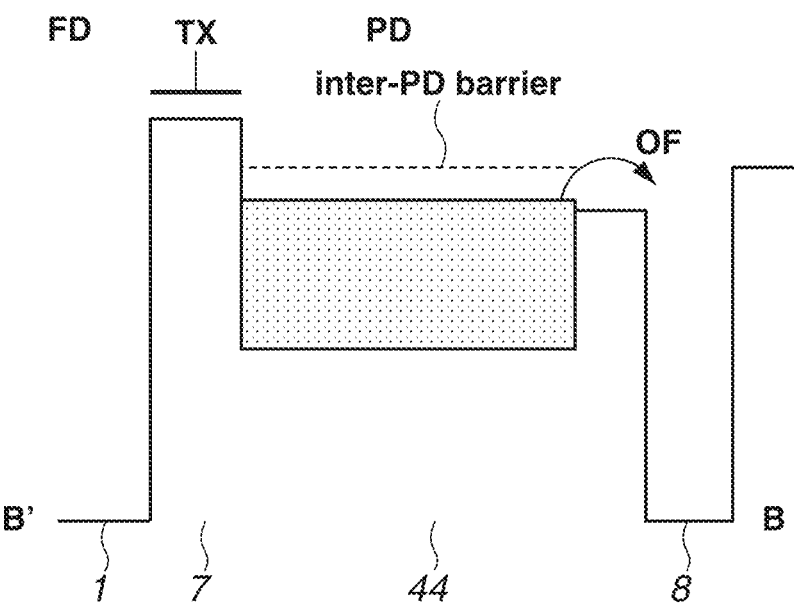
FIGS. 7A and 7B are potential diagrams of the photoelectric conversion apparatus according to the first exemplary embodiment.
Figure 7B:
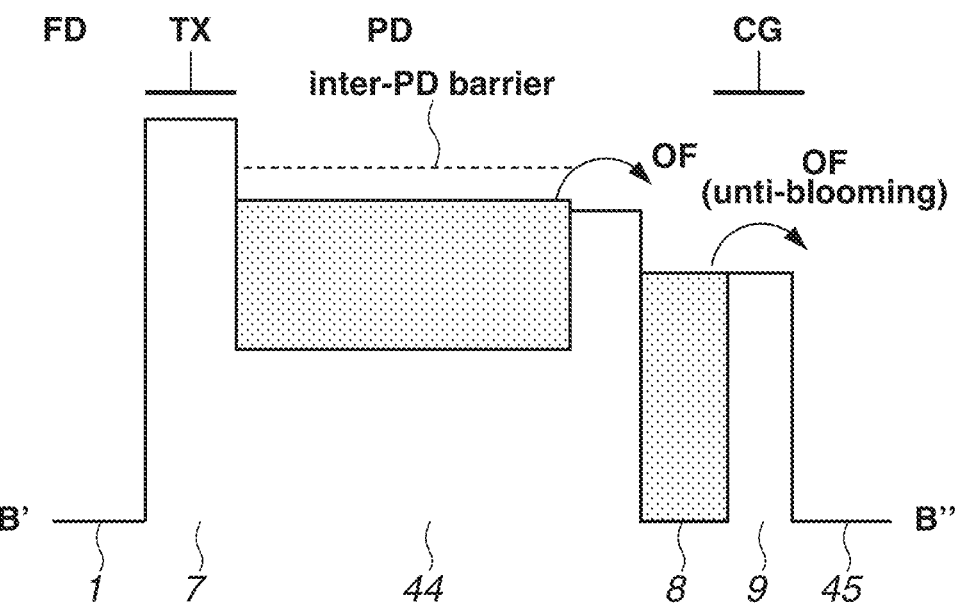

FIG. 6A is a schematic sectional view taken along line B-B' in FIG. 4. FIG. 6B is a schematic sectional view taken along line C-C' in FIG. 4. FIG. 7A is a potential diagram of FIG. 6A during a charge accumulation operation in the photoelectric conversion circuit. FIG. 7B is a potential diagram of FIG. 6B during the charge accumulation operation in the photoelectric conversion circuit.

In an N-type semiconductor substrate 43, semiconductor regions are formed by implantation. The N-type semiconductor region forming the capacitor circuit 8 corresponds to the source of the capacitor-connected transistor 9. As illustrated in FIGS. 6A and 6B, an N-type semiconductor region 44 extends to a position overlapping the N-type semiconductor region forming the capacitor circuit 8. This makes it easier for a charge overflowing from the photoelectric conversion circuit 6 to overflow to the N-type semiconductor region of the capacitor circuit 8.

As illustrated in FIG. 6A, in the present exemplary embodiment, the N-type semiconductor region of the capacitor circuit 8 is sandwiched between isolation portions 40 and 41 formed of insulators. In FIG. 6A, the isolation portions 40 and 41 are formed by STI. The disclosure, however, is not limited to this. Alternatively, the isolation portions 40 and 41 may be formed by PN isolation. One or both of the isolation portions 40 and 41 may not be included.

As illustrated in FIG. 7A, a potential barrier between the photoelectric conversion circuit 6 and the capacitor circuit 8 is lower than a potential barrier between photoelectric conversion circuits (an inter-PD barrier). During a charge accumulation operation in the photoelectric conversion circuit 6, electrons saturated in the photoelectric conversion circuit 6 go beyond a potential barrier between the N-type semiconductor region forming the capacitor circuit 8 and the N-type semiconductor region 44 of the photoelectric conversion circuit 6, and at least a part of the electrons overflows to the N-type semiconductor region forming the capacitor circuit 8. At least one of a charge overflowing from the photoelectric conversion circuit 6 and a signal corresponding to the overflow charge is held in the capacitor circuit 8. Between the photoelectric conversion circuit 6 and a photoelectric conversion circuit with which the photoelectric conversion circuit 6 does not share the FD 1, an isolation region 42 is disposed. Thus, a potential barrier between the photoelectric conversion circuit 6 and the photoelectric conversion circuit that does not share the FD 1 with the photoelectric conversion circuit 6 is higher than the potential barrier between the photoelectric conversion circuit 6 and the capacitor circuit 8. This makes a charge less likely to overflow to the adjacent photoelectric conversion circuit. The isolation region 42 may be formed of a P-type semiconductor region, or may be formed by insulation isolation such as STI or DTI.

As illustrated in FIG. 7B, a potential barrier between the N-type semiconductor region forming the capacitor circuit 8 and the N-type semiconductor region 45 corresponding to the drain of the capacitor-connected transistor 9 is lower than the potential barrier between the N-type semiconductor region 44 and the N-type semiconductor region of the capacitor circuit 8. Thus, a charge overflowing from the capacitor circuit 8 is read out to the N-type semiconductor region 45.

For light irradiation with such a low illuminance that no electron overflows from the photoelectric conversion circuit 6, a signal read in the state where the capacitor-connected transistor 9 and the capacitance addition transistor 5 are off is used. Thus, when a signal is read, the signal can be read in the state where the FD capacitance is small. Thus, it is possible to make noise less likely to occur when the signal is read. For light irradiation with such a high illuminance that an electron overflows from the photoelectric conversion circuit 6, a signal read in the state where the capacitor-connected transistor 9 and the capacitance addition transistor 5 are on is used. Thus, it is possible to extend the dynamic range. As described above, according to the present exemplary embodiment, it is possible to reduce an increase in FD capacitance with a low illuminance while extending the dynamic range.

As described above, in the present exemplary embodiment, it is possible to separate the capacitor-connected transistor 9 from the FD 1 using the capacitance addition transistor 5 and decrease the area of an N-type semiconductor region as a single component forming the FD 1. While the N-type semiconductor region of the FD 1 has PN capacitance in the depth direction of the substrate, the decrease in the area of the N-type semiconductor region enables a decrease in the FD capacitance.

If the capacitor-connected transistors 9, 13, 17, and 21 are placed away from the FD 1 without using the capacitance addition transistor 5, the FD 1 and the drains of the capacitor-connected transistors 9, 13, 17, and 21 are connected by electrical wires. This leads to an increase in capacitance. To reduce the FD capacitance without using wires, it is necessary to take into account a layout configuration in which the FD 1 and the source of the capacitor-connected transistor 9 share a common region or the wiring is shortened. In this case, the degree of freedom in the layout may decrease, and this may also lead to a decrease in the element performance other than noise.

In contrast, according to the present exemplary embodiment, the capacitor-connected transistor 9 and a connection wire for the capacitor-connected transistor 9 can be separated from the FD 1 using the capacitance addition transistor 5, and do not contribute to an increase in the capacitance of the FD 1. The placement of the capacitor-connected transistor 9 and the electrical wire 28 for the capacitor-connected transistor 9 are separated from the FD 1, and do not contribute to an increase in the capacitance of the FD 1. Thus, it is possible to reduce an increase in the FD capacitance.

Figure 8:
FIG. 8 is a timing chart of the photoelectric conversion apparatus according to the first exemplary embodiment.

FIG. 8 is a driving timing chart of the photoelectric conversion apparatus according to the present exemplary embodiment. FIG. 8 illustrates the driving timings of the photoelectric conversion circuits 6, 10, 14, and 18 that share the FD 1 in the pixel 107. Before signals are read from each photoelectric conversion circuit, the FD 1 is reset. Then, a signal of an electron accumulated in the photoelectric conversion circuit is read (HG: high gain), and a signal having an electron amount obtained by combining both electrons in the photoelectric conversion circuit and the capacitor circuit is read (LG: low gain). In FIG. 8, a high-level state is the state where the transistor is on, and a low-level state is the state where the transistor is off.

Initially, signals are read from the photoelectric conversion circuit 6 (PD6 read). The reset transistor 4 (RES) is turned on once to reset the FD 1. Then, at a time T1, a reset level $N_{HG}$ is read (HG N-read). At this time, the capacitance addition transistor 5 is off, and therefore, a signal is readable from the amplification transistor 2 without adding capacitance other than that of the FD 1. Subsequently, at a time T2, the transfer transistor 7 is turned on to transfer a charge from the photoelectric conversion circuit 6 to the FD 1. Then, a signal level $S_{HG}$ is read (HG S-read). A difference $S_{HG}$-$N_{HG}$ between the voltages of the signal level $S_{HG}$ and the reset level $N_{HG}$ is a signal output in an HG mode. Next, at a time T3, the capacitance addition transistor 5 and the capacitor-connected transistor 9 (CG9) are turned on, thus connecting the capacitor circuit 8 to the FD 1.

A signal level $S_{LG}$ is read by combining the electron in the photoelectric conversion circuit 6 transferred to the FD 1 through the foregoing process and an accumulated electron held in the capacitor circuit 8 (LG S-read). At a time T4, the transfer transistor 7 (TX7) is turned on. This process is performed to transfer a signal electron remaining in the photoelectric conversion circuit 6 to the FD 1 again in a case where the number of saturated electrons of the photoelectric conversion circuit 6 is greater than the number of saturated electrons of the FD 1. If the FD 1 is sufficiently large, and there is a relationship where the signal electron in the photoelectric conversion circuit 6 can be completely transferred through the reading operation at the time T2, the turning-on operation on the transfer transistor 7 at the time T4 is not necessary. Suppose that there is a relationship where capacitance obtained by combining the electrical wire 28 connected to the FD 1 and the FD 1 in the state where the capacitor-connected transistor 9 (CG9) is off and the capacitance addition transistor 5 is on is sufficiently large, and the signal electron in the photoelectric conversion circuit 6 can be completely transferred by the reading operation at the time T4. At this time, the turning-on operation on the capacitor-connected transistor 9 may be performed not at the time T3, but after the completion of the turning-on operation at the time T4. At a time T5, the reset transistor 4 (RES) is turned on to discharge the electrons in the FD 1 and a region added to the FD 1, such as the capacitor circuit 8, to the power supply voltage line VDD. Then, a reset level $N_{LG}$ is read (LG N-read). A difference $S_{LG}$-$N_{LG}$ between the signal level $S_{LG}$ and the signal level $N_{LG}$ is a signal output in an LG mode.

After this, similar driving is performed in order on the other photoelectric conversion circuits. More specifically, after the signals are read from the photoelectric conversion circuit 6 and the capacitor circuit 8, signals are read from the photoelectric conversion circuit 10 and the capacitor circuit 12 (PD10 read). Subsequently, signals are read from the photoelectric conversion circuit 14 and the capacitor circuit 16 (PD14 read), and signals are read from the photoelectric conversion circuit 18 and the capacitor circuit 20 (PD18 read). It is possible to perform the process of multiplying each of the signal outputs $S_{HG}$-$N_{HG}$ in the HG mode obtained from these read signals by, for example, capacitance $C_{HG}$ when the signals are read. Similarly, it is possible to perform the process of multiplying each of the signal outputs $S_{LG}$-$N_{LG}$ in the LG mode by, for example, capacitance $C_{LG}$ when the signals are read. Thus, the values $(S_{HG}–N_{HG})\times C_{HG}$ and $(S_{LG}–N_{LG})\times C_{LG}$ obtained through these processes can be compared as continuous signal amounts. In a case where the gain of the amplification circuit 103 is changed in each reading mode, the change is also taken into account.

A photoelectric conversion apparatus according to a second exemplary embodiment is described with reference to FIGS. 9 and 10.

Figure 9:
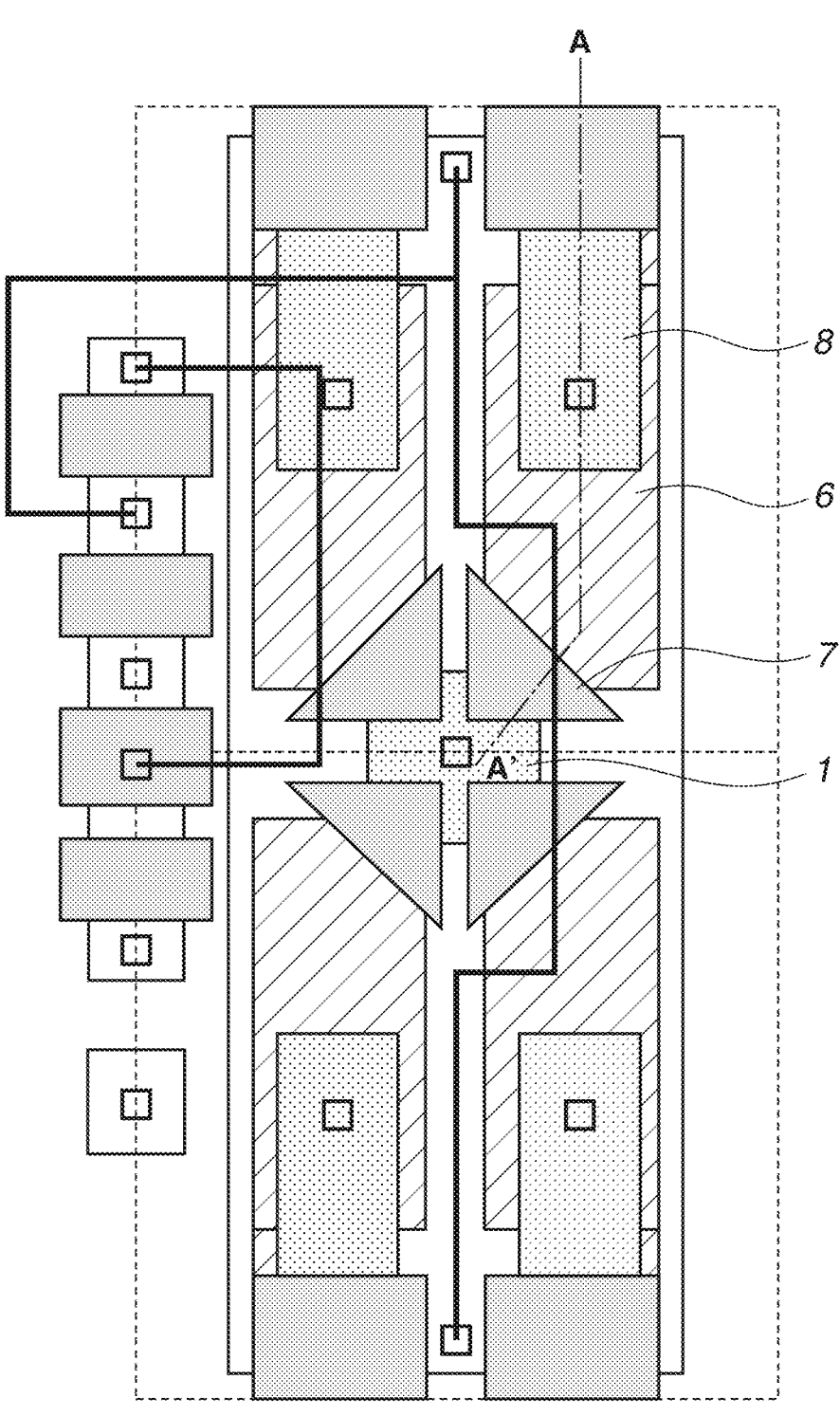
FIG. 9 is a schematic plan view of a pixel of a photoelectric conversion apparatus according to a second exemplary embodiment.
Figure 10:
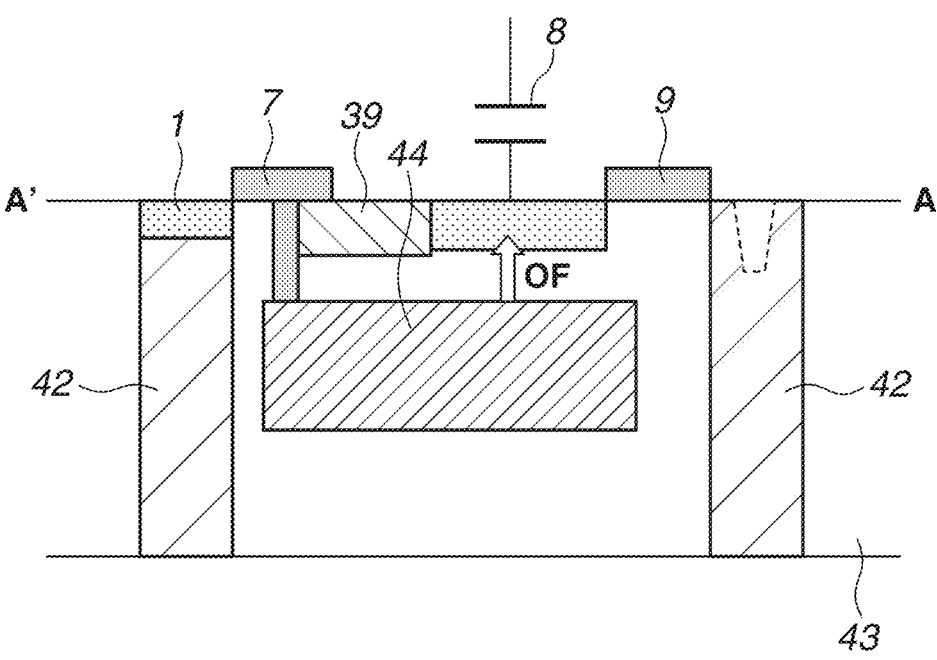
FIG. 10 is a schematic sectional view of a pixel of the photoelectric conversion apparatus according to the second exemplary embodiment.

FIG. 9 is a schematic plan view of a pixel of the photoelectric conversion apparatus according to the present exemplary embodiment. FIG. 10 is a schematic sectional view taken along line A-A' in FIG. 9. The photoelectric conversion apparatus according to the present exemplary embodiment is different from the photoelectric conversion apparatus according to the first exemplary embodiment in that a vertical transfer transistor is used as the transfer transistor 7, and the N-type semiconductor region forming the capacitor circuit 8 is disposed to overlap the N-type semiconductor region 44 in a planar view. Features except for this difference and items described below are substantially similar to those of the first exemplary embodiment, and therefore, components similar to those of the first exemplary embodiment are occasionally designated by the same signs and not described.

As illustrated in FIG. 9, the capacitor circuits are disposed to overlap the photoelectric conversion circuits in a planar view. As illustrated in FIG. 10, the N-type semiconductor region 44 is placed further away from the second surface of the semiconductor substrate than in the first exemplary embodiment. The embedded gate of the vertical transfer transistor is disposed in contact with the N-type semiconductor region 44. With this placement, it is possible to place the N-type semiconductor region 44 and the N-type semiconductor region of the capacitor circuit 8 to overlap each other. Thus, it is possible to decrease the area of a pixel in a planar view. The potential relationships between elements are similar to those in the first exemplary embodiment, and therefore are not described.

According to the present exemplary embodiment, it is possible to reduce an increase in FD capacitance while a plurality of photoelectric conversion circuits shares an FD, as in the first exemplary embodiment. Using a vertical transfer transistor, it is possible to decrease the area of a pixel in a planar view.

Figure 11:
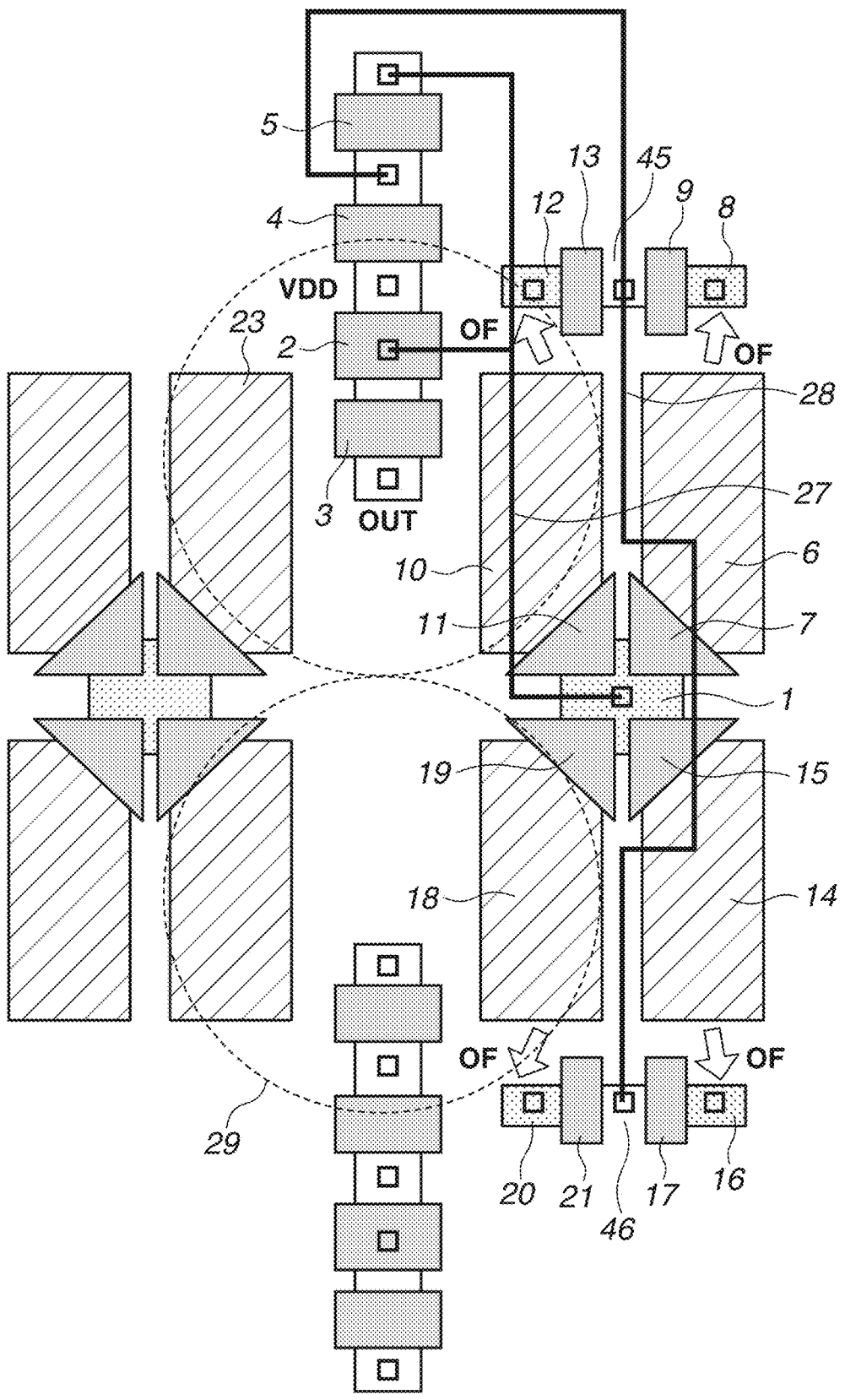
FIG. 11 is a schematic plan view of pixels of a photoelectric conversion apparatus according to a third exemplary embodiment.

A photoelectric conversion apparatus according to a third exemplary embodiment is described with reference to FIG. 11. FIG. 11 is a schematic plan view of pixels of the photoelectric conversion apparatus according to the present exemplary embodiment. The photoelectric conversion apparatus according to the present exemplary embodiment is different from the photoelectric conversion apparatus according to the first exemplary embodiment in that a photoelectric conversion circuit of a certain pixel and a photoelectric conversion circuit of a different pixel share a microlens. Features except for this difference and items described below are substantially similar to those of the first exemplary embodiment, and therefore, components similar to those of the first exemplary embodiment are occasionally designated by the same signs and not described.

As illustrated in FIG. 11, the microlens 29 is placed to overlap a photoelectric conversion circuit of a certain pixel and a photoelectric conversion circuit of a different pixel in a planar view. With this placement, it is possible to match the timings when signals are read from the photoelectric conversion circuits. Thus, it is possible to improve the accuracy of distance measurement.

In the present exemplary embodiment, a first color filter placed to overlap the photoelectric conversion circuit 10 and a second color filter placed to overlap the photoelectric conversion circuit 6 can be color filters of different colors. The color of a third color filter placed to overlap a photoelectric conversion circuit 23 may be the same as the color of the first color filter. This is to measure a distance based on a signal obtained from the photoelectric conversion circuit 10 and a signal obtained from the photoelectric conversion circuit 6.

According to the present exemplary embodiment, it is possible to reduce an increase in FD capacitance while a plurality of photoelectric conversion circuits shares an FD, as in the first exemplary embodiment. It is possible to simultaneously read signals for measuring a distance. Thus, it is possible to improve the accuracy of distance measurement.

Figure 12:
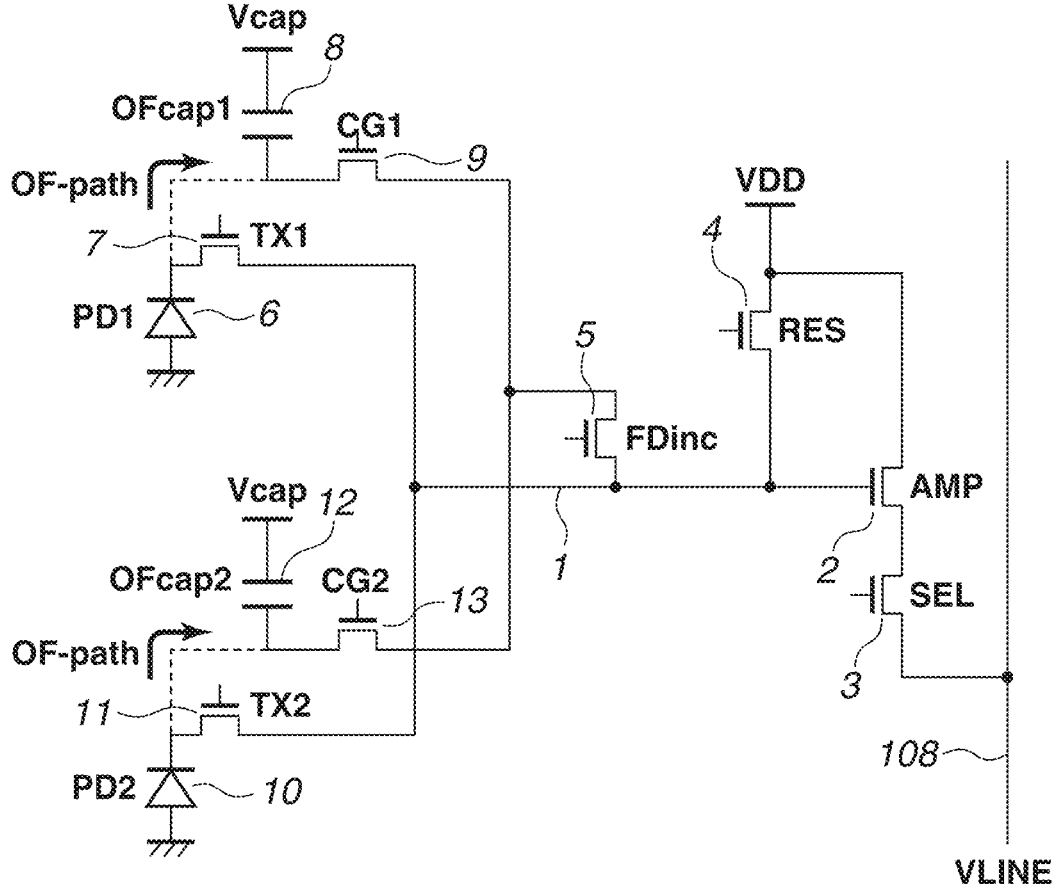
FIG. 12 is an equivalent circuit diagram of a pixel of a photoelectric conversion apparatus according to a fourth exemplary embodiment.

A fourth exemplary embodiment will be described. FIG. 12 is an equivalent circuit diagram of a photoelectric conversion apparatus according to the present exemplary embodiment. The photoelectric conversion apparatus according to the present exemplary embodiment is different from the photoelectric conversion apparatus according to the first exemplary embodiment in that a portion to which the source of the reset transistor 4 is connected is the FD 1, and two photoelectric conversion circuits share the FD 1. Features except for this difference and items described below are substantially similar to those of the first exemplary embodiment, and therefore, components similar to those of the first exemplary embodiment are occasionally designated by the same signs and not described.

Figure 13:
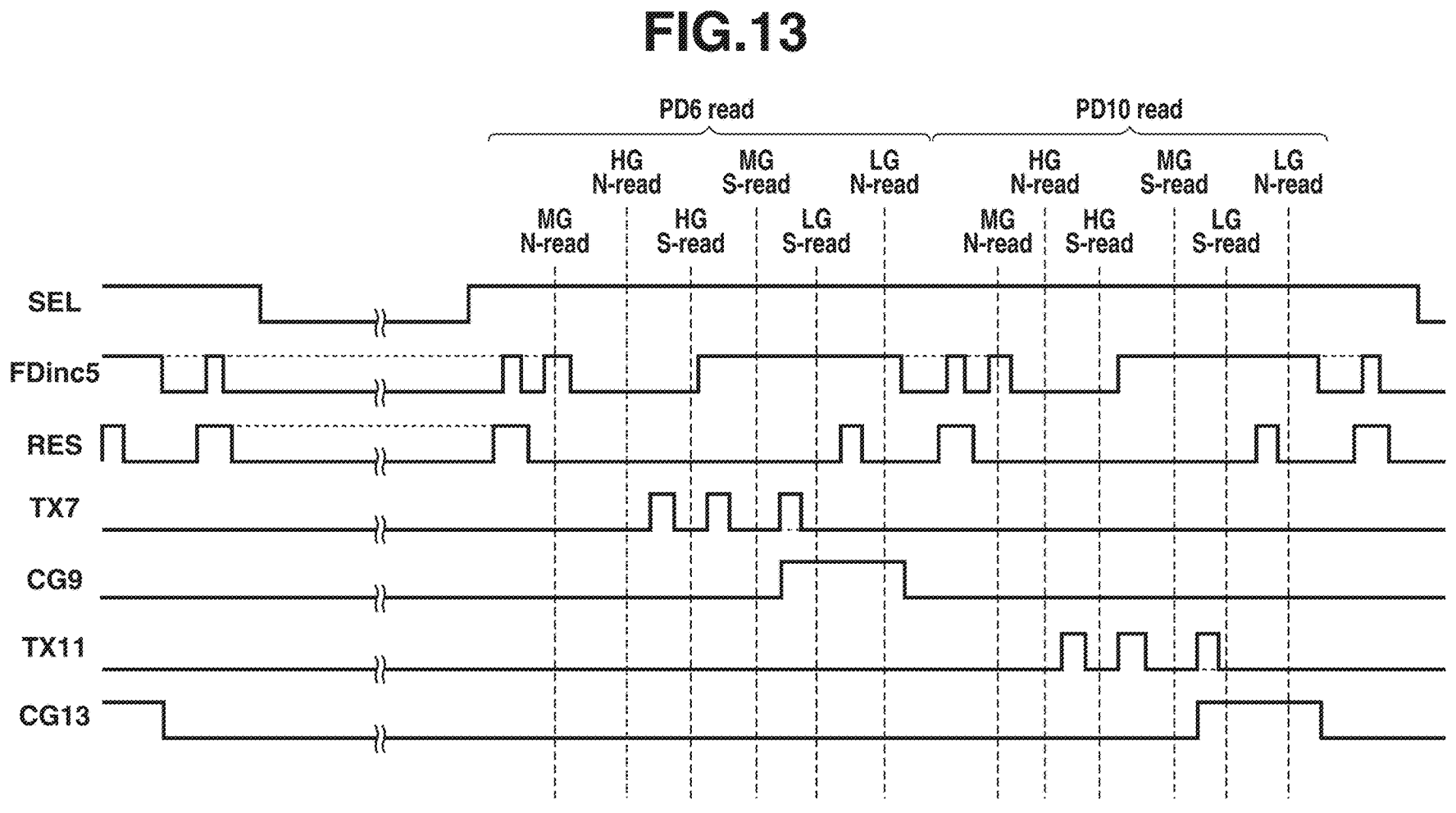

FIG. 13 is a driving timing chart of the photoelectric conversion apparatus according to the present exemplary embodiment. In the present exemplary embodiment, a driving timing chart of a photoelectric conversion apparatus having three reading modes is illustrated. A first mode is an HG reading mode for reading a charge held in each photoelectric conversion circuit with the capacitor circuit not being connected. A second mode is a middle gain (MG) reading mode for turning on the capacitance addition transistor 5 (FDinc) and turning off the capacitor-connected transistor 9 or 13 (CG9 or CG13). A third mode is an LG reading mode for turning on the capacitance addition transistor 5 and the capacitor-connected transistor 9 or 13. Capacitance increases in the order of the first, second, and third modes.

In the second mode, the capacitances of the channel and the source of the capacitance addition transistor 5 (FDinc), the drains of the capacitor-connected transistors CG9 and CG13, and wires connecting the capacitor-connected transistors CG9 and CG13 and the capacitance addition transistor 5 can be added to the FD 1. The second mode in which the capacitance is greater than that in the first mode is added, so that, even in a case where the number of saturated electrons of the photoelectric conversion circuit is greater than the number of saturated electrons of the FD 1 and there is a region to which a signal of the photoelectric conversion circuit cannot be read in the first mode, it is possible to read the signal. At this time, reading noise is less likely to occur than in a case where the signal is read in the third mode. Thus, reading the signal in the second mode enables the reading of the signal with higher accuracy than in the third mode. In the first exemplary embodiment, the MG mode which is the second mode can be added.

Driving timings in FIG. 13 will be described below.

Initially, a signal reading operation for reading signals from the photoelectric conversion circuit 6 is performed (PD6 read). The reset transistor 4 (RES) is turned on once in the state where the capacitance addition transistor 5 (FDinc) is on. Then, a reset level $N_{MG}$ of a region connected in the second mode is read (MG N-read). Next, the capacitance addition transistor 5 (FDinc) is turned off, and a reset level $N_{HG}$ is read (HG N-read). Next, the transfer transistor 7 (TX7) is turned on once, thus transferring a charge from the photoelectric conversion circuit 6 to the FD 1. Then, a signal level $S_{HG}$ with high gain is read (HG S-read). A difference $S_{HG}$-$N_{HG}$ between the signal level $S_{HG}$ and the reset level $N_{HG}$ is a signal obtained in the first mode (the HG mode).

Next, the capacitance addition transistor 5 (FDinc) and the transfer transistor 7 (TX7) are turned on, thus transferring a charge from the photoelectric conversion circuit 6 to the FD 1. Then, a signal level $S_{MG}$ is read (MG S-read). A difference $S_{MG}$-$N_{MG}$ between the signal level $S_{MG}$ and the reset level $N_{MG}$ is a signal obtained in the second mode (the MG mode).

Next, the capacitance addition transistor 5 (FDinc) and the capacitor-connected transistor 9 (CG9) are turned on. Although the transfer transistor 7 is turned on after this in FIG. 13, if the relationship between the FD capacitance and the photoelectric conversion circuit 6 is a relationship where the electron in the photoelectric conversion circuit 6 can be completely transferred, the transfer transistor 7 does not need to be turned on.

Next, the capacitor-connected transistor 9 is turned on, thus connecting the capacitor circuit 8 to the FD 1. Through this process, a signal level $S_{LG}$ can be read by combining electrons in the FD 1 and the wire 28 or the transistors connected to the FD 1, and a signal held in the capacitor circuit 8 (LG S-read). Next, the reset transistor 4 (RES) is turned on, thus discharging the electrons in the FD 1 and a capacitor circuit added to the FD 1, such as the capacitor circuit 8, to the power supply voltage line VDD. Then, a reset level $N_{LG}$ is read (LG N-read). A difference $S_{LG}$-$N_{LG}$ between the signal level $S_{LG}$ and the reset level $N_{LG}$ is a signal obtained in the third mode (the LG mode).

After this, similar driving is performed in order on the other photoelectric conversion circuits. More specifically, after the signals are read from the photoelectric conversion circuit 6 (PD6 read), signals are read from the photoelectric conversion circuit 10 (PD10 read). It is possible to perform the process of multiplying the signal output $S_{HG}$-$N_{HG}$ in the HG mode obtained from these read signals by capacitance $C_{HG}$ when the signals are read in the HG mode. Similarly, it is possible to perform the process of multiplying the signal output $S_{MG}$-$N_{MG}$ in the MG mode by capacitance $C_{MG}$ when the signals are read in the MG mode. Similarly, it is possible to perform the process of multiplying the signal output $S_{LG}$-$N_{LG}$ in the LG mode by, for example, capacitance $C_{LG}$. Thus, the values $(S_{HG}-N_{HG})\times C_{HG}$, $(S_{MG}-N_{MG})\times C_{MG}$, and $(S_{LG}-N_{LG})\times C_{LG}$ obtained through these processes can be compared as continuous signal amounts. In a case where the gain of the amplification circuit 103 is changed in each reading mode, the change is also taken into account.

According to the present exemplary embodiment, it is possible to reduce an increase in FD capacitance while a plurality of photoelectric conversion circuits shares an FD, as in the first exemplary embodiment. Since the reset transistor 4 is connected to the FD 1 not via the capacitance addition transistor 5, it is possible to reset the FD 1 even in the state where the capacitance addition transistor 5 is off.

Figure 14:
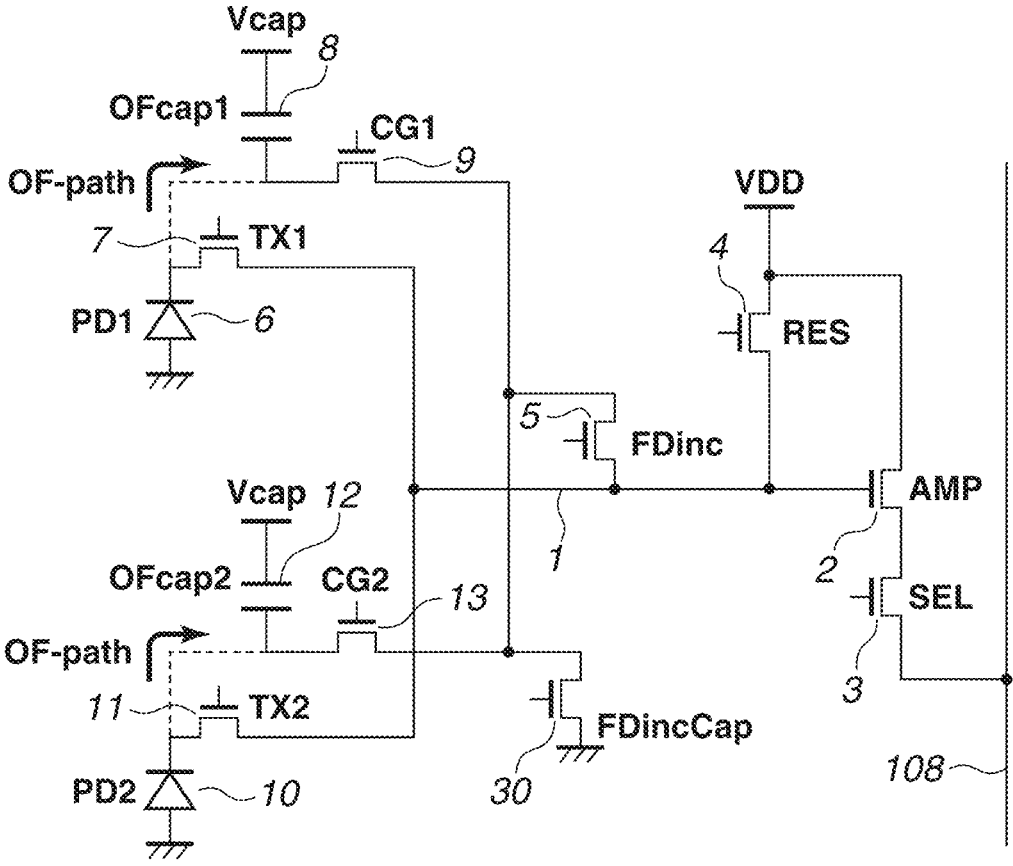
FIG. 14 is an equivalent circuit diagram of a pixel of a photoelectric conversion apparatus according to a fifth exemplary embodiment.

A fifth exemplary embodiment will be described below. FIG. 14 is an equivalent circuit diagram of a photoelectric conversion apparatus according to the fifth exemplary embodiment. The photoelectric conversion apparatus according to the present exemplary embodiment is different from the photoelectric conversion apparatus according to the fourth exemplary embodiment in that a capacitor circuit 30 is connected to a node connecting the capacitance addition transistor 5 and the capacitor-connected transistors 9 and 13. Features except for this difference and items described below are substantially similar to those of the fourth exemplary embodiment, and therefore, components similar to those of the fourth exemplary embodiment are occasionally designated by the same signs and not described.

For example, in the circuit diagram illustrated in FIG. 14, the capacitor circuit 30 can apply a fixed potential to the gate of the capacitor circuit 30 and accumulate an electron below the gate. The capacitor circuit 30 may short-circuit the source and the drain of the capacitor circuit 30 and accumulate an electron at a node connected to the gate as a fixed potential. As the capacitor circuit 30, an MIM capacitor may be used.

According to the present exemplary embodiment, it is possible to reduce an increase in FD capacitance while a plurality of photoelectric conversion circuits shares an FD, as in the fourth exemplary embodiment. This increases capacitance $C_{HG}$ when signals are read in the LG mode. Thus, it is possible to increase the number of electrons that can be read in the LG mode. Further, since the reset transistor 4 is connected to the FD 1 not via the capacitance addition transistor 5, it is possible to reset the FD 1 even in the state where the capacitance addition transistor 5 is off. It is possible to increase capacitance that holds a charge overflowing from a photoelectric conversion circuit.

In FIG. 14, one node of the reset transistor 4 is connected to the FD 1. The configuration, however, is not limited to this. Alternatively, for example, one node of the reset transistor 4 may be connected to the node connecting the capacitance addition transistor 5 and the capacitor-connected transistors 9 and 13.

Figure 15:
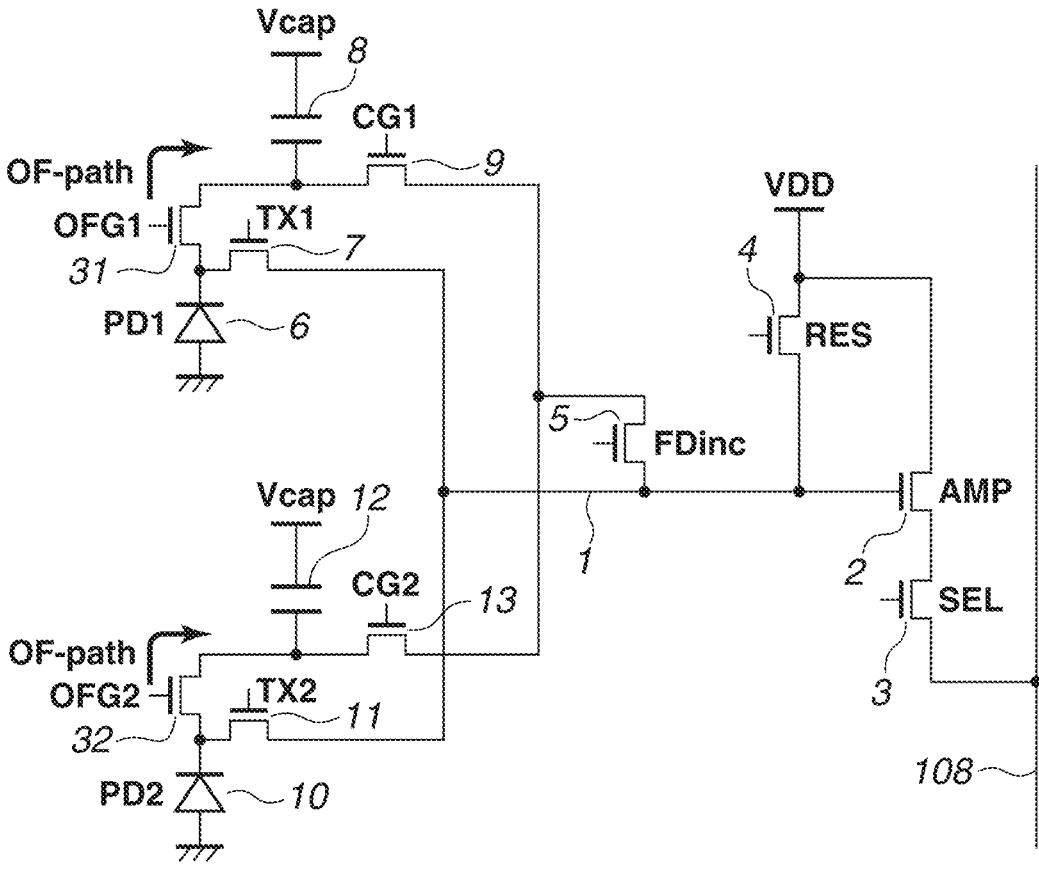
FIG. 15 is an equivalent circuit diagram of a pixel of a photoelectric conversion apparatus according to a sixth exemplary embodiment.

A sixth exemplary embodiment will be described below. FIG. 15 is an equivalent circuit diagram of a photoelectric conversion apparatus according to the sixth exemplary embodiment. The photoelectric conversion apparatus according to the present exemplary embodiment is different from the photoelectric conversion apparatus according to the fourth exemplary embodiment in that control transistors 31 and 32 that control potential barriers between the photoelectric conversion circuits 6 and 10 and the capacitor circuits 8 and 12 are disposed. Features except for this difference and items described below are substantially similar to those of the fourth exemplary embodiment, and therefore, components similar to those of the fourth exemplary embodiment are occasionally designated by the same signs and not described.

The control transistor 31 controls a potential barrier between the photoelectric conversion circuit 6 and the capacitor circuit 8. The control transistor 32 controls a potential barrier between the photoelectric conversion circuit 10 and the capacitor circuit 12.

Each of the control transistors 31 and 32 can be used in a case where the overflow path of an electron from the photoelectric conversion circuit to the capacitor circuit is substantially parallel to the second surface of the semiconductor substrate and has such a depth as to influence the gate voltage of the control transistor. For example, the control transistor can be used in a case where the overflow path is 0.3 μm or less from the second surface of the semiconductor substrate.

For example, if the gate voltage of the control transistor is heightened, the control transistor is turned on, and the potential barrier between the photoelectric conversion circuit and the N-type semiconductor region of the capacitor circuit can be lowered. If the gate voltage of the control transistor is lowered, the control transistor is turned off, and the potential barrier between the photoelectric conversion circuit and the N-type semiconductor region of the capacitor circuit can be heightened. A fixed potential appropriate for an operation may be applied to the gate voltage of the control transistor.

According to the present exemplary embodiment, it is possible to reduce an increase in FD capacitance while a plurality of photoelectric conversion circuits shares an FD, as in the fourth exemplary embodiment. Since the reset transistor 4 is connected to the FD 1 not via the capacitance addition transistor 5, it is possible to reset the FD 1 even in the state where the capacitance addition transistor 5 is off. Regardless of the amount of saturated charge of a photoelectric conversion circuit, it is possible to adjust a charge overflowing from the photoelectric conversion circuit to a capacitor circuit.

Figure 16:
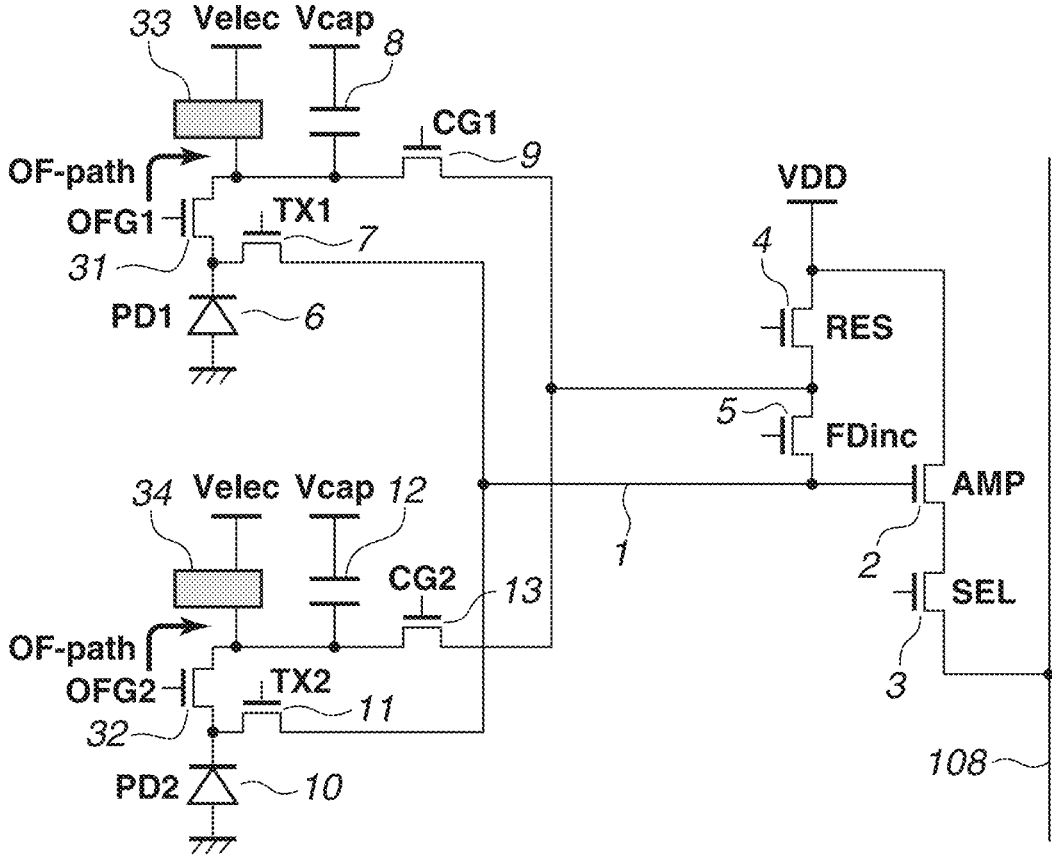
FIG. 16 is an equivalent circuit diagram of a pixel of a photoelectric conversion apparatus according to a seventh exemplary embodiment.

A seventh exemplary embodiment will be described below. FIG. 16 is an equivalent circuit diagram of a photoelectric conversion apparatus according to the seven exemplary embodiment. The photoelectric conversion apparatus according to the present exemplary embodiment is different from the photoelectric conversion apparatus according to the sixth exemplary embodiment in that an electrochromic film of which the light transmission properties change according to an applied voltage is added to the drain of each control transistor. Features except for this difference and items described below are substantially similar to those of the sixth exemplary embodiment, and therefore, components similar to those of the sixth exemplary embodiment are occasionally designated by the same signs and not described.

As illustrated in FIG. 16, electrochromic films 33 and 34 and the capacitor circuits 8 and 12 are connected together via the control transistors 31 and 32. To each of the electrochromic films 33 and 34, a potential Velec and the potential of the drain of the control transistor are applied. It is desirable to dispose the electrochromic film to overlap the photoelectric conversion circuit in a planar view.

The transmittance of the electrochromic film can be high in a reset state.

For example, the potential Velec and a reset potential are set to the same potential. For example, a voltage to be applied to the electrochromic film is 0 V. If light having a high illuminance is incident on the photoelectric conversion circuit, and a charge overflows from the photoelectric conversion circuit, the potential of the drain of the control transistor changes. This increases the voltage applied to the electrochromic film and decreases the transmittance. Thus, light is less likely to be incident on the photoelectric conversion circuit. Thus, the sensitivity of the photoelectric conversion circuit decreases, and it is possible to extend the dynamic range.

According to the present exemplary embodiment, an electrochromic film is disposed with respect to each photoelectric conversion circuit. Thus, it is possible to adjust the sensitivity of each photoelectric conversion circuit.

As the electrochromic film, a material of which the transmittance changes according to an applied voltage, such as tungsten oxide, magnesium-titanium alloy, magnesium-nickel alloy, or tantalum oxide, can be used.

According to the present exemplary embodiment, it is possible to reduce an increase in FD capacitance while a plurality of photoelectric conversion circuits shares an FD, as in the fourth exemplary embodiment. Regardless of the amount of saturated charge of a photoelectric conversion circuit, it is possible to adjust a charge overflowing from the photoelectric conversion circuit to a capacitor circuit. It is possible to adjust the sensitivity of each photoelectric conversion circuit. Thus, it is possible to extend the dynamic range.

Figure 17:
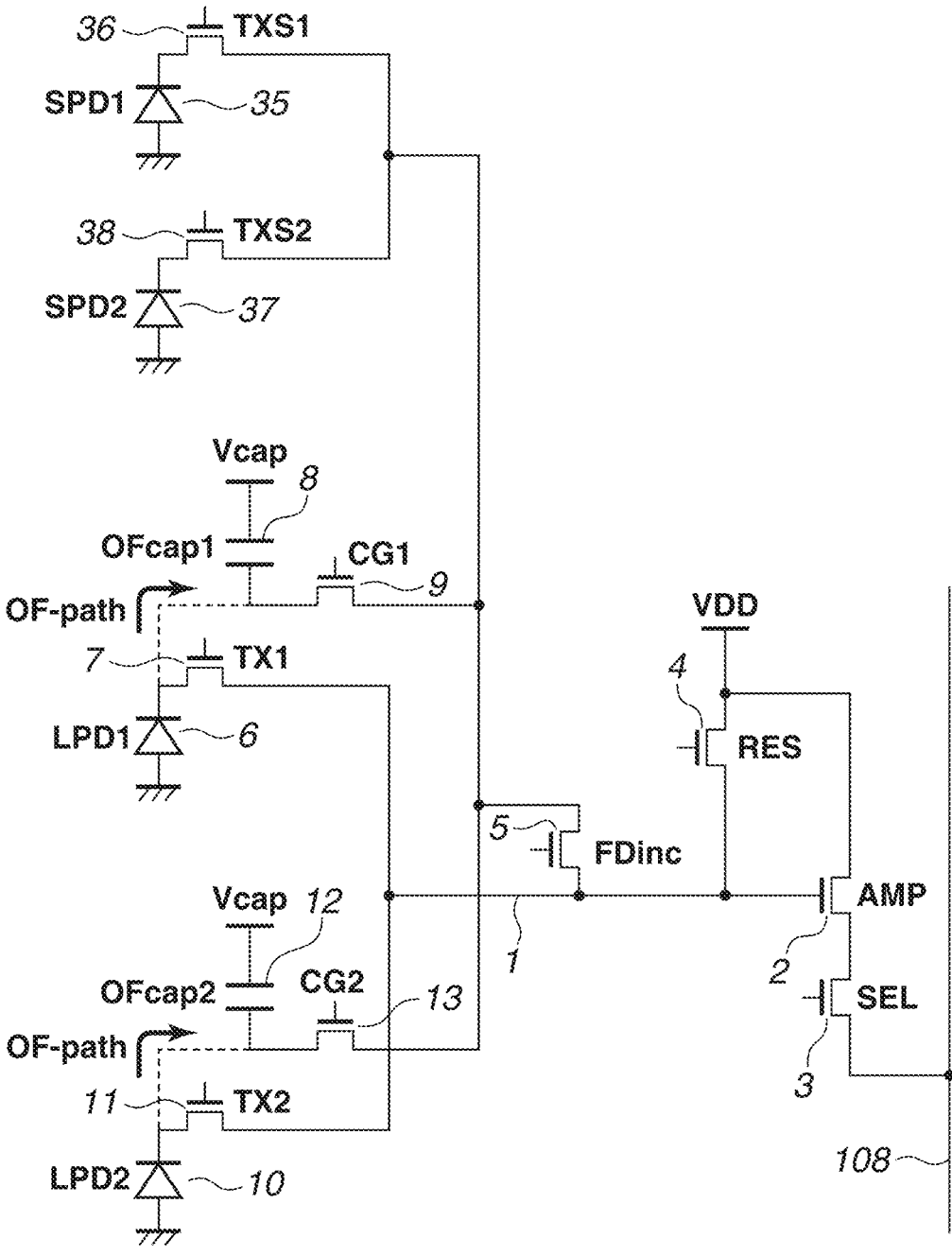
FIG. 17 is an equivalent circuit diagram of a pixel of a photoelectric conversion apparatus according to an eighth exemplary embodiment.

An eighth exemplary embodiment will be described below. FIG. 17 is an equivalent circuit diagram of a photoelectric conversion apparatus according to the eighth exemplary embodiment. The photoelectric conversion apparatus according to the present exemplary embodiment is different from the photoelectric conversion apparatus according to the fourth exemplary embodiment in that the pixel includes photoelectric conversion circuits 35 and 37 and transfer transistors 36 and 38. Features except for this difference and items described below are substantially similar to those of the fourth exemplary embodiment, and therefore, components similar to those of the fourth exemplary embodiment are occasionally designated by the same signs and not described.

Figure 18:
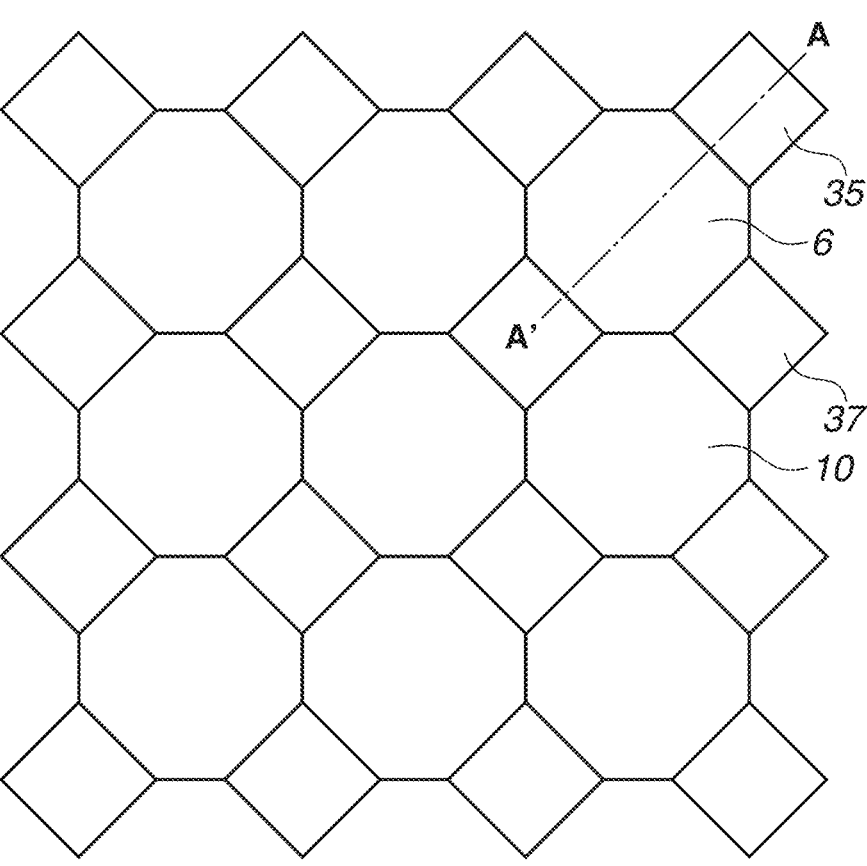
FIG. 18 is a schematic plan view of a pixel of the photoelectric conversion apparatus according to the eighth exemplary embodiment.
Figure 19:
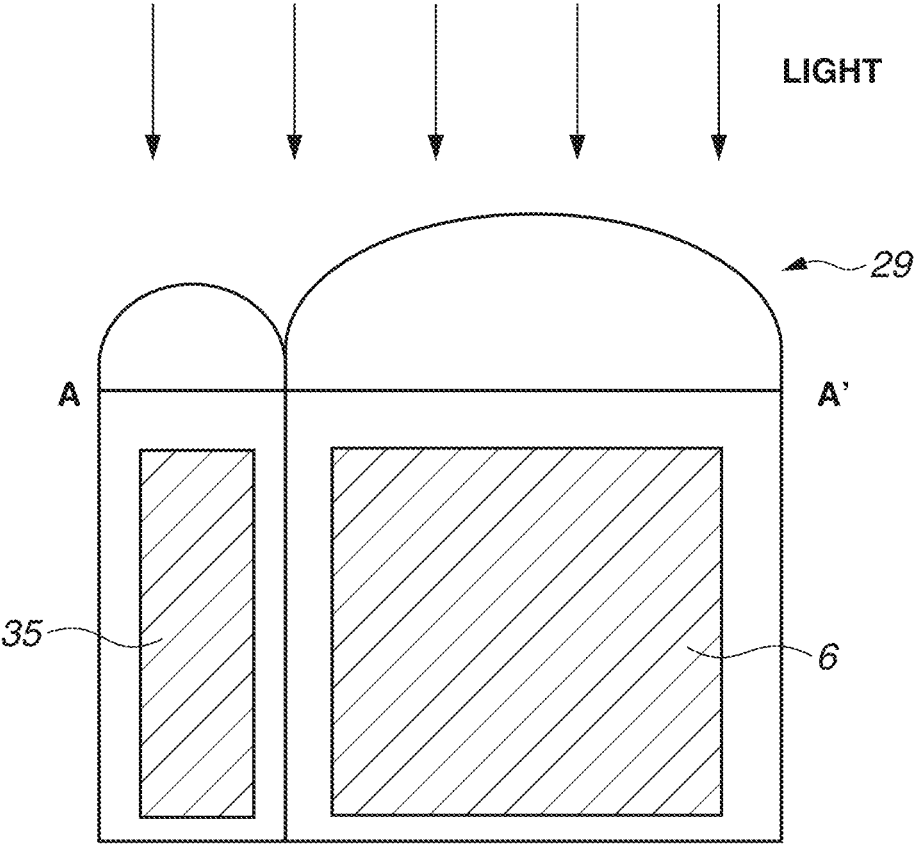
FIG. 19 is a schematic plan view of a pixel of the photoelectric conversion apparatus according to the eighth exemplary embodiment.

FIG. 18 is a schematic plan view of a pixel of the photoelectric conversion apparatus according to the present exemplary embodiment. FIG. 19 is a schematic sectional view taken along line A-A' in FIG. 18. The photoelectric conversion circuits are arranged in a grid as illustrated in FIG. 18. The areas of the photoelectric conversion circuits 35 and 37 are different from those of the photoelectric conversion circuits 6 and 10.

Although the areas of the photoelectric conversion circuits 35 and 37 are smaller than those of the photoelectric conversion circuits 6 and 10 in FIGS. 18 and 19, the areas of the photoelectric conversion circuits 35 and 37 may be larger than those of the photoelectric conversion circuits 6 and 10. As described above, the photoelectric conversion circuits 35 and 37 are used as sub-pixels having different incidence sensitivities, so that it is possible to extend the dynamic range. As illustrated in FIG. 19, the microlens 29 may be placed with respect to each photoelectric conversion circuit.

Figure 20:
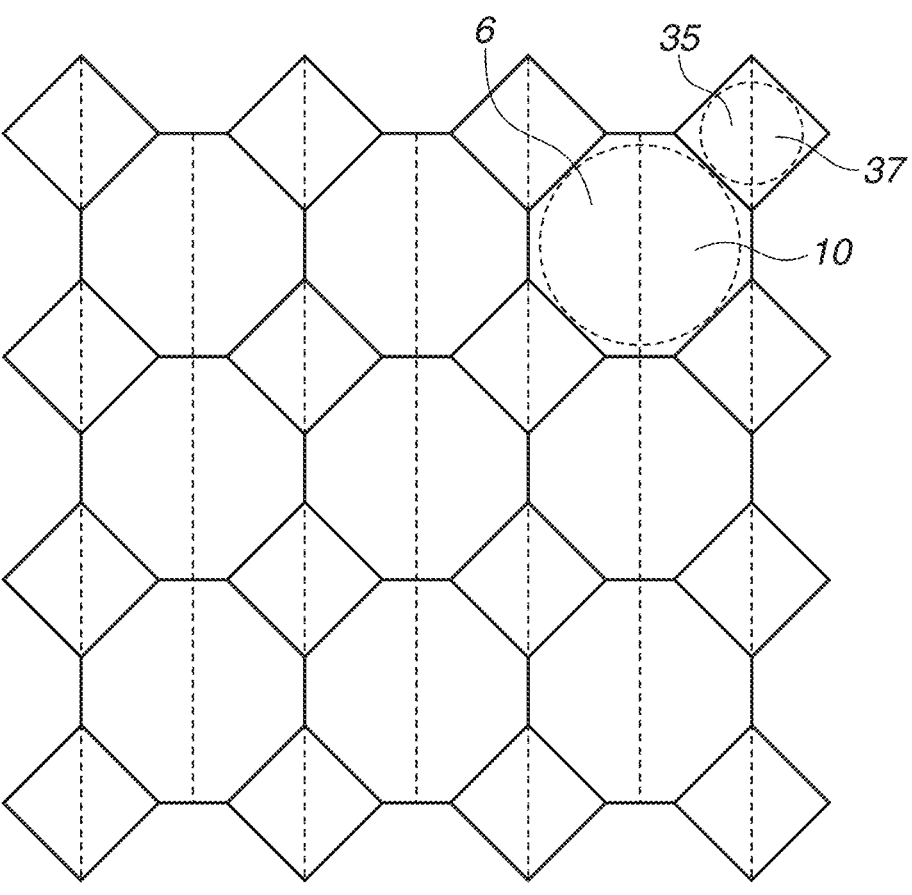
FIG. 20 is a schematic plan view of a pixel of a variation of the photoelectric conversion apparatus according to the eighth exemplary embodiment.

FIG. 20 is a schematic plan view of a pixel of a photoelectric conversion apparatus according to another example of the present exemplary embodiment. In FIG. 20, the photoelectric conversion circuits 35 and 37 share a microlens, and the photoelectric conversion circuits 6 and 10 share a microlens. Thus, it is possible to extend the dynamic range while handling image surface phase difference AF. At this time, signals output from the photoelectric conversion circuits corresponding to each microlens are read in the state where the photoelectric conversion circuits are placed side by side in all the pixels. Alternatively, in some of the pixels, a microlens may be displaced for photoelectric conversion circuits placed one on top of the other.

According to the present exemplary embodiment, it is possible to reduce an increase in FD capacitance while a plurality of photoelectric conversion circuits shares an FD, as in the fourth exemplary embodiment. Since the reset transistor 4 is connected to the FD 1 not via the capacitance addition transistor 5, it is possible to reset the FD 1 even in the state where the capacitance addition transistor 5 is off. Further, it is possible to extend the dynamic range.

Figure 21:
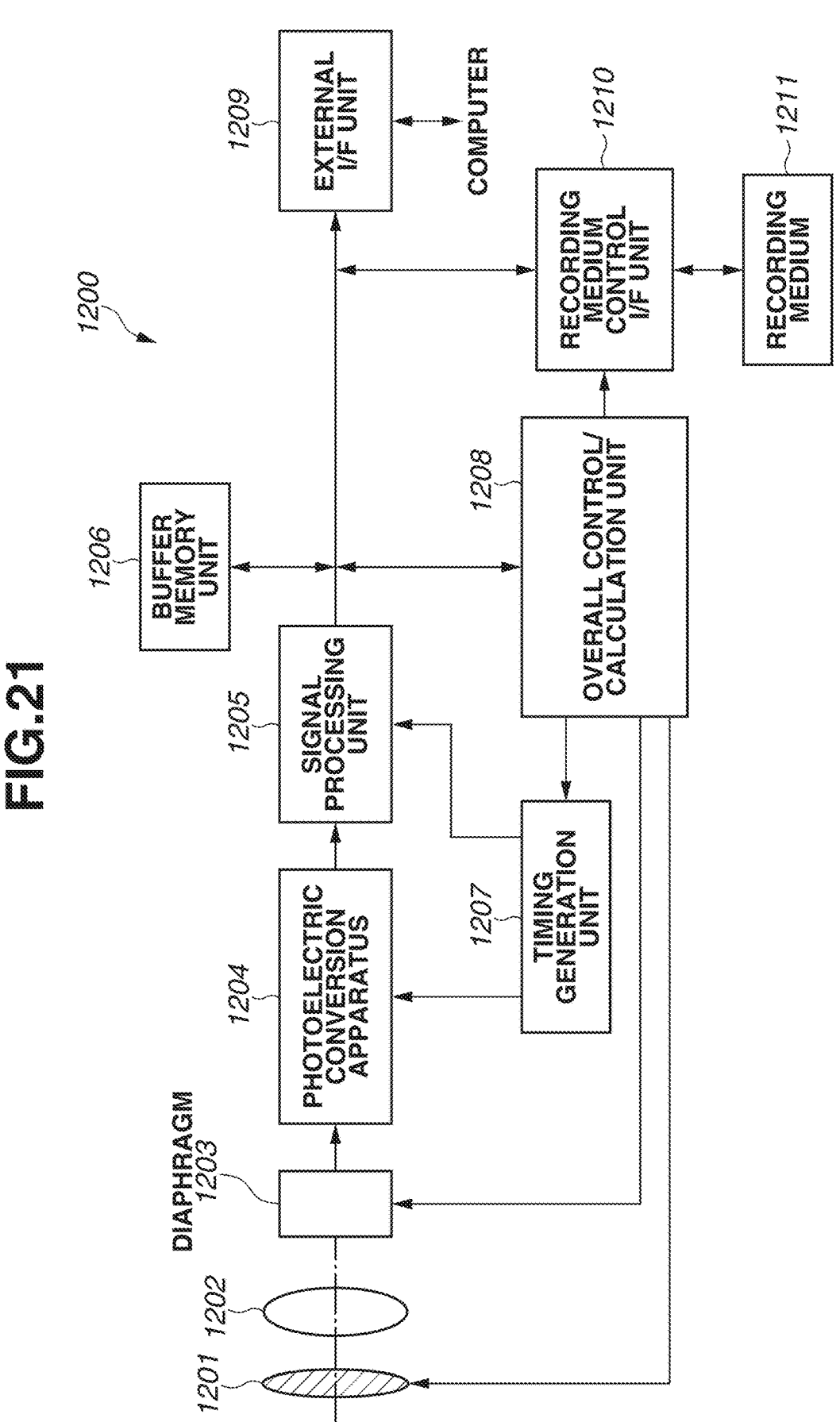
FIG. 21 is a block diagram of a photoelectric conversion system according to a ninth exemplary embodiment.

A ninth exemplary embodiment will be described. FIG. 21 is a block diagram illustrating the configuration of a photoelectric conversion system 1200 according to the ninth exemplary embodiment. The photoelectric conversion system 1200 according to the present exemplary embodiment includes a photoelectric conversion apparatus 1204. Any of the photoelectric conversion apparatuses described in the above exemplary embodiments is applicable to the photoelectric conversion apparatus 1204. The photoelectric conversion system 1200 can be used as, for example, an imaging system. Specific examples of the imaging system include a digital still camera, a digital camcorder, and a monitoring camera. FIG. 21 illustrates a digital still camera as an example of the photoelectric conversion system 1200.

The photoelectric conversion system 1200 illustrated in FIG. 21 includes the photoelectric conversion apparatus 1204, a lens 1202 that forms an optical image of an object on the photoelectric conversion apparatus 1204, a diaphragm 1203 that makes the amount of light passing through the lens 1202 variable, and a barrier 1201 that protects the lens 1202.

The lens 1202 and the diaphragm 1203 are an optical system for collecting light on the photoelectric conversion apparatus 1204.

The photoelectric conversion system 1200 includes a signal processing circuit 1205 that processes an output signal output from the photoelectric conversion apparatus 1204. The signal processing circuit 1205 performs a signal processing operation for performing various types of correction and compression on an input signal where necessary and outputting the resulting signal. The photoelectric conversion system 1200 further includes a buffer memory circuit 1206 that temporarily stores image data, and an external interface circuit (external I/F circuit) 1209 that is used to communicate with an external computer.

The photoelectric conversion system 1200 further includes a recording medium 1211 such as a semiconductor memory in or from which captured data is recorded or read, and a recording medium control interface circuit (recording medium control I/F circuit) 1210 that is used to record or read captured data in or from the recording medium 1211.

The recording medium 1211 may be built into the photoelectric conversion system 1200, or may be attachable to and detachable from the photoelectric conversion system 1200.

The photoelectric conversion system 1200 may wirelessly communicate with the recording medium 1211 via the recording medium control I/F circuit 1210, and may wirelessly communicate via the external I/F circuit 1209.

The photoelectric conversion system 1200 further includes an overall control/calculation circuit 1208 that performs various calculations and also controls the entirety of the digital still camera, and a timing generation circuit 1207 that outputs various timing signals to the photoelectric conversion apparatus 1204 and the signal processing circuit 1205. The timing signals may be input from outside, and the photoelectric conversion system 1200 only needs to include at least the photoelectric conversion apparatus 1204 and the signal processing circuit 1205 that processes an output signal output from the photoelectric conversion apparatus 1204. The timing generation circuit 1207 may be provided in the photoelectric conversion apparatus 1204. The overall control/calculation circuit 1208 and the timing generation circuit 1207 may be configured to perform a part or all of the control function of the photoelectric conversion apparatus 1204.

The photoelectric conversion apparatus 1204 outputs an image signal to the signal processing circuit 1205. The signal processing circuit 1205 performs predetermined signal processing on the image signal output from the photoelectric conversion apparatus 1204 and outputs image data. The signal processing circuit 1205 generates an image using the image signal. The signal processing circuit 1205 may perform a distance measurement calculation on a signal output from the photoelectric conversion apparatus 1204. The signal processing circuit 1205 and the timing generation circuit 1207 may be provided in the photoelectric conversion apparatus 1204. In other words, the signal processing circuit 1205 and the timing generation circuit 1207 may be provided on a substrate on which pixels are disposed. Alternatively, a configuration may be employed in which the signal processing circuit 1205 and the timing generation circuit 1207 are provided on another substrate. An imaging system is configured with the photoelectric conversion apparatuses according to the above exemplary embodiments, so that it is possible to achieve an imaging system capable of acquiring an image with increased quality.

Figure 22A:
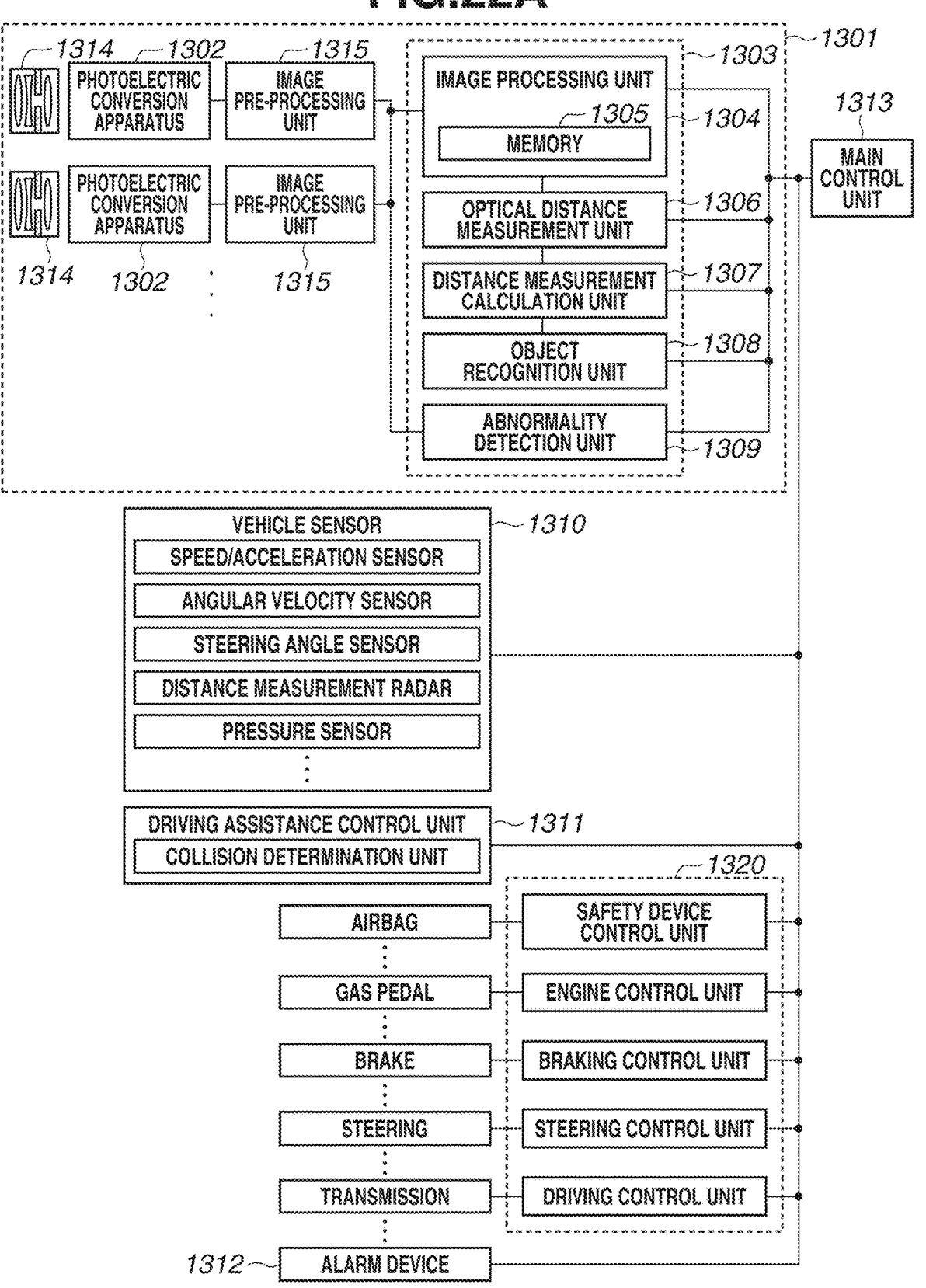
FIG. 22A is a block diagram of a photoelectric conversion system according to a tenth exemplary embodiment.
Figure 22B:
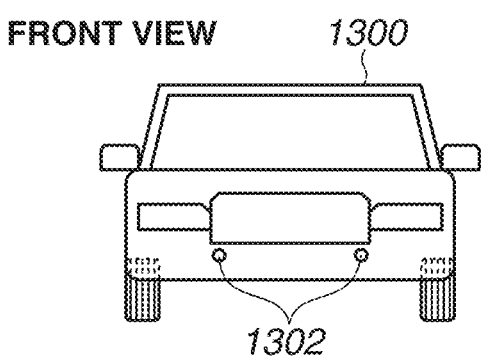
FIG. 22B illustrates an example of the placement of the photoelectric conversion system.
Figure 22B:
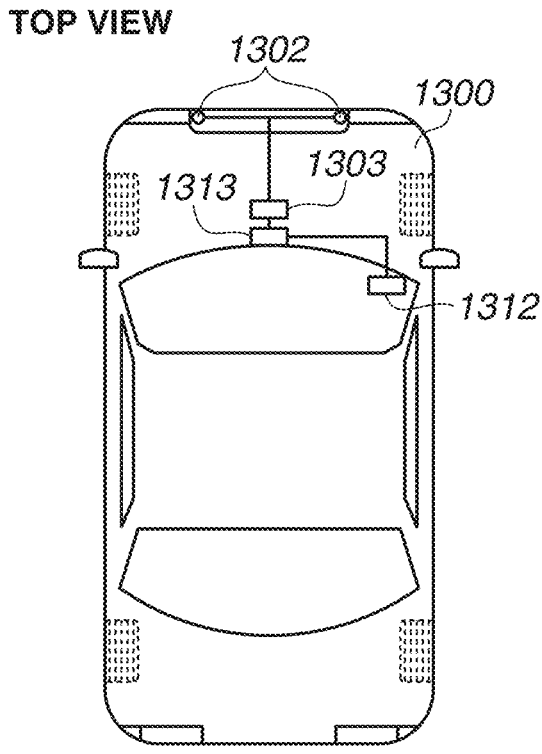
Figure 22B:
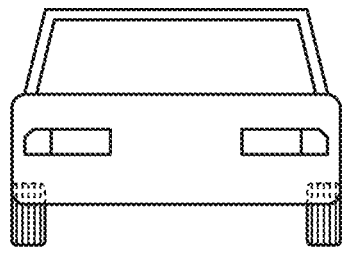
Figure 23:
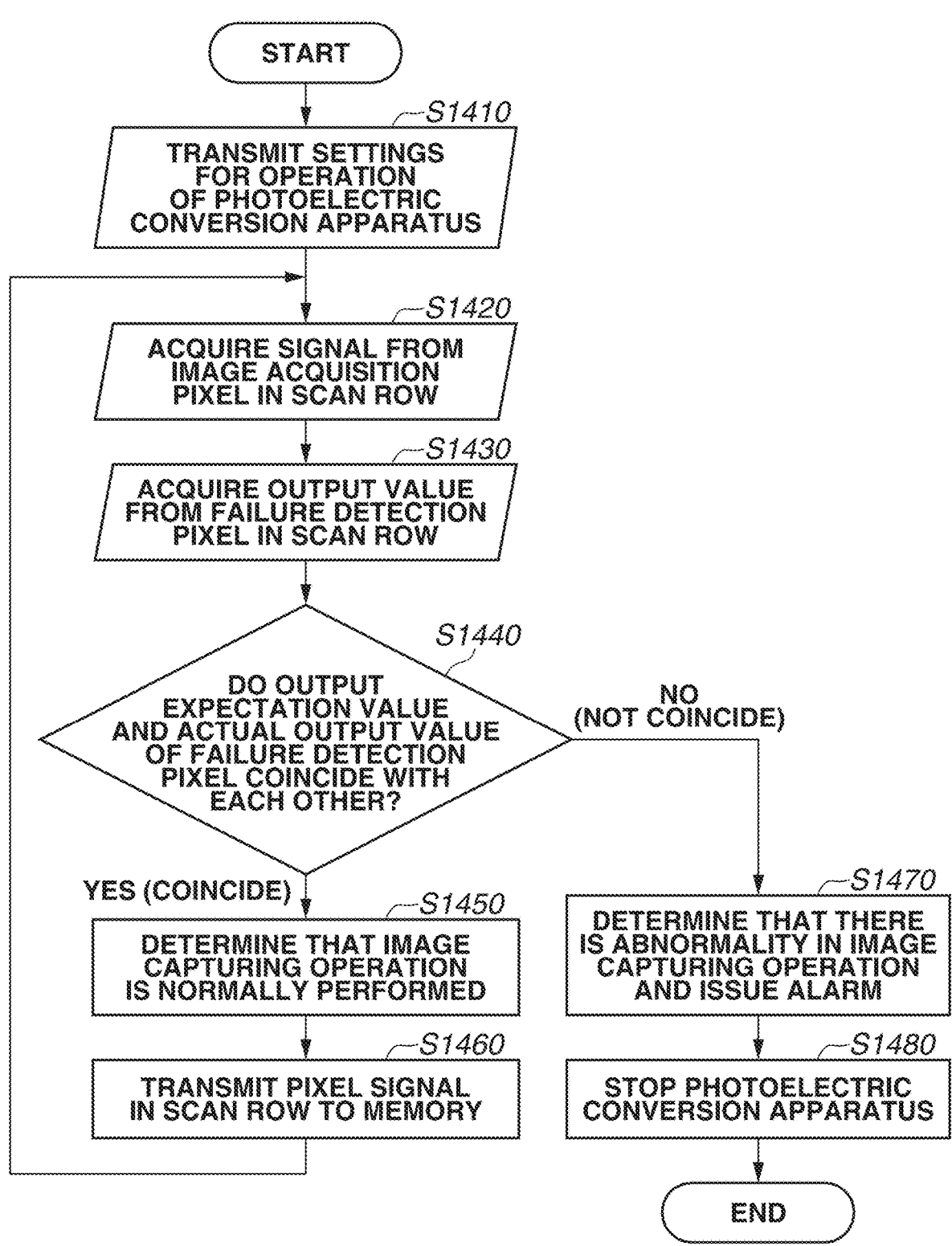
FIG. 23 is a flowchart of a photoelectric conversion system according to the tenth exemplary embodiment.

A tenth exemplary embodiment will be described below. With reference to FIGS. 22A, 22B, and 23, a photoelectric conversion system and a movable body according to the tenth exemplary embodiment will be described. FIGS. 22A and 22B are schematic diagrams illustrating examples of the configurations of the photoelectric conversion system and the movable body according to the present exemplary embodiment. FIG. 23 is a flowchart illustrating the operation of the photoelectric conversion system according to the present exemplary embodiment. In the present exemplary embodiment, an in-vehicle camera is illustrated as an example of the photoelectric conversion system.

FIGS. 22A and 22B illustrate examples of a vehicle system and a photoelectric conversion system for capturing an image that is mounted on the vehicle system. A photoelectric conversion system 1301 includes a photoelectric conversion apparatus 1302, an image pre-processing circuit 1315, an integrated circuit 1303, and an optical system 1314. The optical system 1314 forms an optical image of an object on the photoelectric conversion apparatus 1302. The photoelectric conversion apparatus 1302 converts the optical image of the object formed by the optical system 1314 into an electric signal. The photoelectric conversion apparatus 1302 is the photoelectric conversion apparatus according to any of the above exemplary embodiments. The image pre-processing circuit 1315 performs predetermined signal processing on the signal output from the photoelectric conversion apparatus 1302. The function of the image pre-processing circuit 1315 may be built into the photoelectric conversion apparatus 1302. In the photoelectric conversion system 1301, at least two sets of the optical system 1314, the photoelectric conversion apparatus 1302, and the image pre-processing circuit 1315 are provided so that outputs from the image pre-processing circuit 1315 in the respective sets are input to the integrated circuit 1303.

The integrated circuit 1303 is an integrated circuit for an imaging system and includes an image processing circuit 1304 including a memory 1305, an optical distance measurement circuit 1306, a distance measurement calculation circuit 1307, an object recognition circuit 1308, and an abnormality detection circuit 1309. The image processing circuit 1304 performs a development process or image processing such as defect correction on an output signal from each image pre-processing circuit 1315. The memory 1305 primarily stores a captured image or stores the position of a defect of an imaging pixel. The optical distance measurement circuit 1306 focuses on an object or measures the distance from the object. The distance measurement calculation circuit 1307 calculates distance measurement information from a plurality of pieces of image data acquired by the plurality of photoelectric conversion apparatuses 1302. The object recognition circuit 1308 recognizes an object, such as a vehicle, a road, a sign, and a person. If detecting an abnormality in the photoelectric conversion apparatuses 1302, the abnormality detection circuit 1309 informs a main control circuit 1313 of the abnormality.

The integrated circuit 1303 may be achieved by hardware designed exclusively for the integrated circuit 1303, or achieved by a software module, or achieved by the combination of these. Alternatively, the integrated circuit 1303 may be achieved by a field-programmable gate array (FPGA) or an application-specific integrated circuit (ASIC), or achieved by the combination of these.

The main control circuit 1313 performs overall control of the operations of the photoelectric conversion system 1301, a vehicle sensor 1310, and a control circuit 1320. It is also possible to employ a method in which the main control circuit 1313 is not included, and the photoelectric conversion system 1301, the vehicle sensor 1310, and the control circuit 1320 individually include communication interfaces, and each transmit and receive a control signal through a communication network (e.g., the Controller Area Network (CAN) standard).

The integrated circuit 1303 has the function of transmitting a control signal or a setting value to each photoelectric conversion apparatus 1302 in response to receiving a control signal from the main control circuit 1313 or with the aid of a control circuit of the integrated circuit 1303.

The photoelectric conversion system 1301 is connected to the vehicle sensor 1310 and can detect the running states, such as the speed, the yaw rate, and the steering angle, of a vehicle in which the photoelectric conversion system 1301 is provided, the environment outside the vehicle, and the states of another vehicle and an obstacle. The vehicle sensor 1310 is also a distance information acquisition circuit that acquires distance information regarding the distance from a target object. The photoelectric conversion system 1301 is also connected to a driving assistance control circuit 1311 that performs various types of driving assistance, such as automatic steering, automatic cruising, and a collision prevention function. In particular, regarding a collision determination function, based on a detection result of the photoelectric conversion system 1301 or the vehicle sensor 1310, a collision determination circuit estimates a collision with another vehicle or an obstacle or determines the presence or absence of a collision with another vehicle or an obstacle. Thus, in a case where a collision is estimated, avoidance control is performed. Further, when a collision occurs, a safety device is activated.

The photoelectric conversion system 1301 is also connected to an alarm device 1312 that issues an alarm to a driver based on the determination result of the collision determination circuit. For example, if the determination result of the collision determination circuit indicates a high possibility of a collision, the main control circuit 1313 applies a brake, returns the gas pedal, or reduces or prevents the engine output, thus controlling the vehicle to avoid a collision and reduce damage. The alarm device 1312 warns a user by setting off an alarm such as a sound, displaying alarm information on a screen of a display circuit of an automotive navigation system or a meter panel, or imparting a vibration to the seat belt or the steering.

In the present exemplary embodiment, the photoelectric conversion system 1301 captures the periphery, such as the front direction or the rear direction, of the vehicle. FIG. 22B illustrates an example of the placement of the photoelectric conversion system 1301 in a case where the photoelectric conversion system 1301 captures the front direction of the vehicle.

The two photoelectric conversion apparatuses 1302 are disposed in a front portion of a vehicle 1300. More specifically, a center line with respect to the movement direction or the outer shape (e.g., the width) of the vehicle 1300 is regarded as a symmetrical axis, and the two photoelectric conversion apparatuses 1302 are disposed line-symmetrically with respect to the symmetrical axis. This is desirable for acquiring distance information regarding the distance between the vehicle 1300 and an image capturing target object or determining the possibility of a collision. It is also desirable to place the photoelectric conversion apparatuses 1302 so as not to block the field of vision of the driver when the driver visually checks the situation outside the vehicle 1300 from the driver's seat. It is desirable to place the alarm device 1312 so that the alarm device 1312 easily enters the field of vision of the driver.

Next, a failure detection operation of each photoelectric conversion apparatus 1302 in the photoelectric conversion system 1301 will be described with reference to FIG. 23. The failure detection operation of the photoelectric conversion apparatus 1302 is performed according to steps S1410 to S1480 illustrated in FIG. 23.

In step S1410, settings when the photoelectric conversion apparatus 1302 starts up are made. In other words, settings for the operation of the photoelectric conversion apparatus 1302 are transmitted from outside the photoelectric conversion system 1301 (e.g., the main control circuit 1313) or inside the photoelectric conversion system 1301, and an image capturing operation and a failure detection operation of the photoelectric conversion apparatus 1302 are started.

Next, in step S1420, a pixel signal is acquired from an effective pixel. In step S1430, an output value from a failure detection pixel provided for failure detection is acquired. The failure detection pixel includes a photoelectric conversion circuit, as in the effective pixel. A predetermined voltage is written to the photoelectric conversion circuit. The failure detection pixel outputs a signal corresponding to the voltage written in the photoelectric conversion circuit. Steps S1420 and S1430 may be reversed.

Next, in step S1440, it is determined whether an output expectation value of the failure detection pixel and an actual output value of the failure detection pixel coincide with each other. As a result of the determination in step S1440, if the output expectation value and the actual output value coincide with each other (YES in step S1440), the processing proceeds to step S1450. In step S1450, it is determined that the image capturing operation is normally performed. Then, the processing proceeds to step S1460. In step S1460, the pixel signal in a scan row is transmitted to and primarily saved in the memory 1305. Then, the processing returns to step S1420. In step S1420, the failure detection operation is continued. If, as a result of the determination in step S1440, the output expectation value and the actual output value do not coincide with each other (NO in step S1440), the processing proceeds to step S1470. In step S1470, it is determined that there is an abnormality in the image capturing operation. Then, an alarm is issued to the main control circuit 1313 or the alarm device 1312. The alarm device 1312 causes the display circuit to display indicating that an abnormality is detected. Then in step S1480, the photoelectric conversion apparatus 1302 is stopped, and the operation of the photoelectric conversion system 1301 is ended.

In the present exemplary embodiment, an example has been illustrated where the flowchart loops with respect to each row. Alternatively, the flowchart may loop with respect to a plurality of rows, or the failure detection operation may be performed with respect to each frame. The issuance of the alarm in step S1470 may be notified to the outside of the vehicle 1300 via a wireless network.

In the present exemplary embodiment, a description has been provided of control for preventing a vehicle from colliding with another vehicle. Alternatively, the present exemplary embodiment is also applicable to control for automatically driving a vehicle by following another vehicle, or control for automatically driving a vehicle so as to stay in a lane. Further, the photoelectric conversion system 1301 can be applied not only to a vehicle such as a vehicle in which the photoelectric conversion system 1301 is provided, but also to a movable body (a movable apparatus) such as a vessel, an aircraft, or an industrial robot. Additionally, the photoelectric conversion system 1301 can be applied not only to a movable body but also to a device widely using object recognition, such as an intelligent transportation system (ITS).

A configuration may be employed in which the photoelectric conversion apparatus according to the disclosure can further acquire various pieces of information such as distance information.

The above exemplary embodiments can be appropriately changed without departing from their technical ideas. The exemplary embodiments of the disclosure also include an example where the configuration of a part of any of the exemplary embodiments is added to another exemplary embodiment, and an example where the configuration of a part of any of the exemplary embodiments is replaced with the configuration of a part of another exemplary embodiment.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-138746, filed Aug. 27, 2021, which is hereby incorporated by reference herein in its entirety.

What is claimed is:

1. A photoelectric conversion apparatus comprising:
a first photoelectric conversion circuit and a second photoelectric conversion circuit;
a floating diffusion node configured to hold signal charges transferred from the first and second photoelectric conversion circuits;
a first transfer transistor configured to control transfer of a signal charge from the first photoelectric conversion circuit to the floating diffusion node;
a second transfer transistor configured to control transfer of a signal charge from the second photoelectric conversion circuit to the floating diffusion node;
an amplification transistor connected to the floating diffusion node;
a first capacitor circuit configured to hold a signal charge overflowing from the first photoelectric conversion circuit; and
a second capacitor circuit configured to hold a signal charge overflowing from the second photoelectric conversion circuit,
wherein the first capacitor circuit is connected to a capacitance addition transistor via a first capacitor-connected transistor,
wherein the second capacitor circuit is connected to the capacitance addition transistor via a second capacitor-connected transistor,
wherein the first and second capacitor-connected transistors are connected to the floating diffusion node via the capacitance addition transistor,
wherein the first photoelectric conversion circuit includes a first semiconductor region of a first conductivity type where carriers of the same conductivity type as a signal charge are majority carriers,
wherein the first capacitor circuit includes a second semiconductor region of the first conductivity type,
wherein a part of the first semiconductor region overlaps the second semiconductor region in a planar view,
wherein the second photoelectric conversion circuit includes a third semiconductor region of the first conductivity type,
wherein a potential barrier between the first and second semiconductor regions is lower than a potential barrier between the first and third semiconductor regions,
wherein the first and second photoelectric conversion circuits are included in a first pixel,
wherein a third photoelectric conversion circuit and a fourth photoelectric conversion circuit are included in a second pixel, and
wherein a potential barrier between the first and second pixels is higher than the potential barrier between the first and second semiconductor regions.

2. The photoelectric conversion apparatus according to claim 1, wherein a path of a signal charge read via the first transfer transistor and a path of a signal charge read via the first capacitor-connected transistor are separate.

3. The photoelectric conversion apparatus according to claim 1, further comprising a fourth semiconductor region of the first conductivity type,
wherein the fourth semiconductor region forms a source or a drain of the first capacitor-connected transistor and a source or a drain of the second capacitor-connected transistor.

4. The photoelectric conversion apparatus according to claim 3, wherein the floating diffusion node is connected to a reset transistor.

5. The photoelectric conversion apparatus according to claim 4, wherein the floating diffusion node is connected to the reset transistor via the capacitance addition transistor.

6. The photoelectric conversion apparatus according to claim 4, wherein the fourth semiconductor region forms a source or a drain of the reset transistor.

7. The photoelectric conversion apparatus according to claim 1, wherein a microlens is placed to overlap the first and second photoelectric conversion circuits in a planar view.

8. The photoelectric conversion apparatus according to claim 1,
wherein a microlens is placed to overlap the first and third photoelectric conversion circuits in a planar view.

9. The photoelectric conversion apparatus according to claim 1, wherein deep trench isolation is disposed between the first and second photoelectric conversion circuits.

10. The photoelectric conversion apparatus according to claim 1,
wherein the first photoelectric conversion circuit is disposed on a semiconductor substrate,
wherein the semiconductor substrate includes a first surface on which a gate of the first transfer transistor is disposed, and a second surface opposed to the first surface, and
wherein light is incident on the second surface.

11. The photoelectric conversion apparatus according to claim 1, wherein the first transfer transistor includes a vertical transfer transistor.

12. The photoelectric conversion apparatus according to claim 1, wherein the first capacitor circuit includes a metal-insulator-metal capacitor.

13. The photoelectric conversion apparatus according to claim 1,
wherein the third photoelectric conversion circuit shares the floating diffusion node, and
wherein an area of the first photoelectric conversion circuit and an area of the third photoelectric conversion circuit are different in a planar view.

14. The photoelectric conversion apparatus according to claim 1, wherein the photoelectric conversion apparatus has a first mode in which the capacitance addition transistor and the first and second capacitor-connected transistors are turned off and a signal is read, and a second mode in which the capacitance addition transistor and the first and second capacitor-connected transistors are turned on and a signal is read.

15. The photoelectric conversion apparatus according to claim 14, wherein the photoelectric conversion apparatus has a third mode in which the capacitance addition transistor is turned on, the first and second capacitor-connected transistors are turned off, and a signal is read.

16. A photoelectric conversion system comprising:
the photoelectric conversion apparatus according to claim 1; and a signal processing circuit configured to process a signal output from the photoelectric conversion apparatus.

17. A movable body comprising:
the photoelectric conversion apparatus according to claim 1;
an information acquisition circuit configured to acquire distance information regarding a distance to a target object based on a signal from the photoelectric conversion apparatus; and
a control circuit configured to control the movable body based on the distance information.

18. A photoelectric conversion apparatus comprising:
a first photoelectric conversion circuit and a second photoelectric conversion circuit;
a floating diffusion node configured to hold signal charges transferred from the first and second photoelectric conversion circuits;
a first transfer transistor configured to control transfer of a signal charge from the first photoelectric conversion circuit to the floating diffusion node;
a second transfer transistor configured to control transfer of a signal charge from the second photoelectric conversion circuit to the floating diffusion node;
an amplification transistor connected to the floating diffusion node;
a first capacitor circuit configured to hold a signal charge overflowing from the first photoelectric conversion circuit;
a second capacitor circuit configured to hold a signal charge overflowing from the second photoelectric conversion circuit, and
a fourth semiconductor region of a first conductivity type,
wherein the first capacitor circuit is connected to a capacitance addition transistor via a first capacitor-connected transistor,
wherein the second capacitor circuit is connected to the capacitance addition transistor via a second capacitor-connected transistor,
wherein the first and second capacitor-connected transistors are connected to the floating diffusion node via the capacitance addition transistor,
wherein the first photoelectric conversion circuit includes a first semiconductor region of the first conductivity type where carriers of the same conductivity type as a signal charge are majority carriers,
wherein the first capacitor circuit includes a second semiconductor region of the first conductivity type,
wherein a part of the first semiconductor region overlaps the second semiconductor region in a planar view,
wherein the fourth semiconductor region forms a source or a drain of the first capacitor-connected transistor and a source or a drain of the second capacitor-connected transistor,
wherein the floating diffusion node is connected to a reset transistor, and
wherein the floating diffusion node is connected to the reset transistor via the capacitance addition transistor.

* * * * *